United States Patent [19]

Kawashima

[11] Patent Number: 5,528,372
[45] Date of Patent: Jun. 18, 1996

[54] ALIGNMENT MARK, LASER TRIMMER AND SEMICONDUCTOR DEVICE MANUFACTURING PROCESS

[75] Inventor: Shoichiro Kawashima, Yokohama, Japan

[73] Assignee: Fujitsu Limited, Kawasaki, Japan

[21] Appl. No.: 300,850

[22] Filed: Sep. 6, 1994

Related U.S. Application Data

[63] Continuation of Ser. No. 667,161, Mar. 11, 1991, abandoned.

[30] Foreign Application Priority Data

Mar. 12, 1990 [JP] Japan ................................. 2-60593

[51] Int. Cl.$^6$ .................................................. G01B 11/00
[52] U.S. Cl. ................................................................ 356/401
[58] Field of Search ................................... 356/399–401; 355/53; 427/162

[56] References Cited

U.S. PATENT DOCUMENTS

| | | | |
|---|---|---|---|
| 3,603,728 | 9/1971 | Arimura | 178/6.8 |
| 3,660,157 | 5/1972 | Villers et al. | 117/212 |
| 4,240,094 | 12/1980 | Mader . | |
| 4,377,028 | 3/1983 | Imahashi | 29/574 |
| 4,618,317 | 10/1986 | Shimizu et al. | 156/628 |
| 4,632,557 | 12/1986 | Thompson | 356/401 |
| 4,635,345 | 1/1987 | Hankins et al. . | |
| 4,769,523 | 9/1988 | Tanimoto et al. | 219/121.6 |
| 4,880,309 | 11/1989 | Wanta | 356/401 |
| 5,059,808 | 10/1991 | Tasui et al. | 250/548 |

FOREIGN PATENT DOCUMENTS

| | | |
|---|---|---|
| 56-49516 | 5/1981 | Japan . |
| 56-49537 | 5/1981 | Japan . |
| 56-51838 | 5/1981 | Japan . |
| 58-90728 | 5/1983 | Japan . |
| 64-50528 | 2/1989 | Japan . |

*Primary Examiner*—Richard A. Rosenberger
*Assistant Examiner*—K. P. Hantis
*Attorney, Agent, or Firm*—Armstrong, Westerman, Hattori, McLeland & Naughton

[57] ABSTRACT

In a semiconductor device fabrication process, a so-called alignment mark or position-alignment mark, a laser trimmer are used. The position-alignment mark makes a considerable difference in amount between a vertically reflected laser beam light from the position-alignment mark and that from the background thereof to strengthen a contrast between the position-alignment mark and the background surrounding the mark, so that a signal-to-noise ratio (SN ratio) is considerably improved to enable a precise position alignment to be performed in the semiconductor device fabrication process. The position-alignment mark comprises: a position-detecting target having high reflectance; and a pair of low-reflectance regions which sandwich the position-detecting target therebetween.

24 Claims, 17 Drawing Sheets

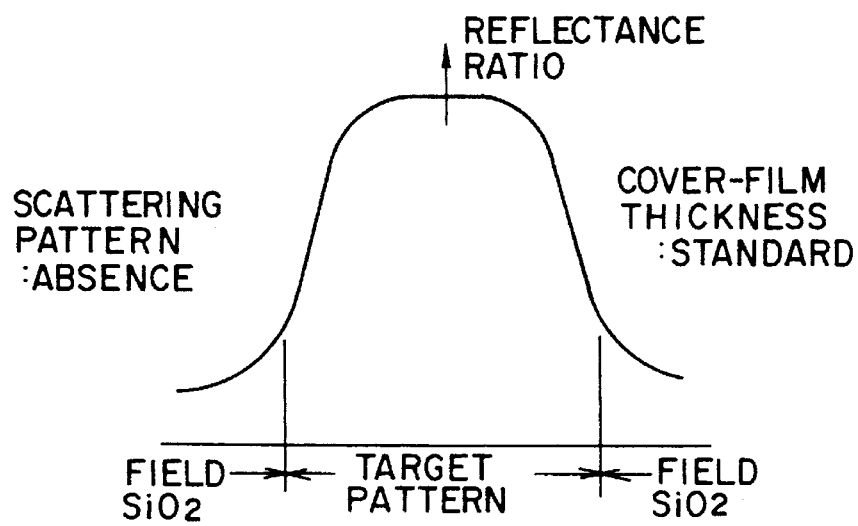
Fig. 7(a')
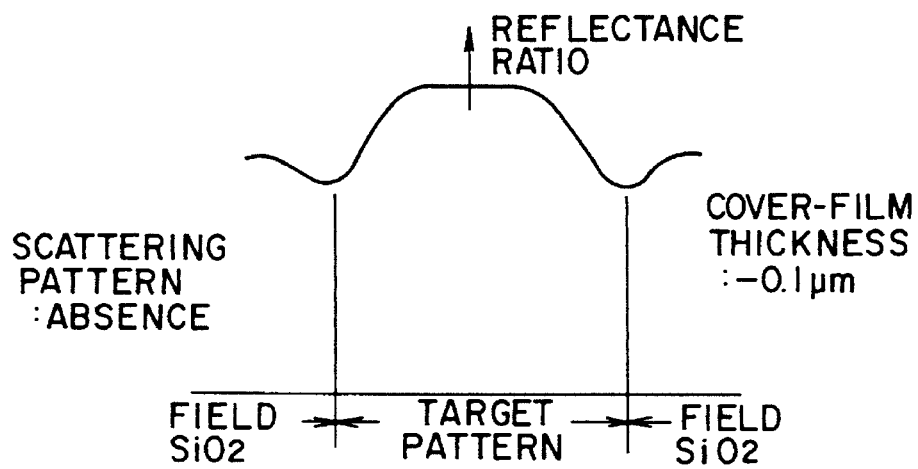
Fig. 7(b')
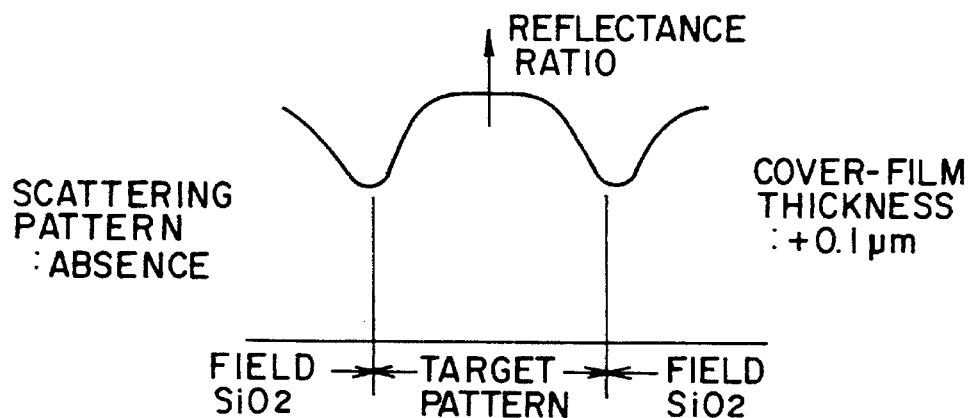
Fig. 7(c')

LASER-BEAM SCANNING DIRECTION

ALIGNMENT MARK, LASER TRIMMER AND SEMICONDUCTOR DEVICE MANUFACTURING PROCESS

This application is a continuation of application Ser. No. 07/667,161 filed Mar. 11, 1991, now abandoned.

BACKGROUND OF THE INVENTION

1. Field of the Invention

The present invention relates to a so-called alignment mark or position-alignment mark, and to a laser trimmer widely used in semiconductor device fabrication processes and a semiconductor manufacturing process.

2. Description of the Prior Art

In general, in the semiconductor-device fabrication process, a precise position alignment or so-called "mask alignment" is required each time a mask pattern is reduced in size and transferred to a silicon wafer by optical reduction-photolithographic techniques. A precise position alignment is also required where a laser trimming apparatus cuts a laser fuse on a device pattern.

For example, where the laser trimming apparatus is used to cut the laser fuse of the device pattern, expansion and contraction of the device pattern occurring in the fabrication process often produce differences in the coordinate systems of the device pattern and the laser trimming apparatus. Unless the coordinate system of the device pattern on the silicon wafer (hereinafter referred to as the "design-basis coordinate system") coincides with that of the laser trimming apparatus (hereinafter referred to as the "apparatus-basis coordinate system"), it is impossible for the laser trimming apparatus to project its laser beam light onto a precise position on the wafer. This is because the position of a fuse (to be cut) based on the design data varies during the fabrication process. This variation results in a cutting failure.

Heretofore, a plurality of conventional position-alignment marks have been formed on the device pattern to make the apparatus-basis coordinate system precisely coincide with the design-basis coordinate system of the device pattern. Each of the conventional position-alignment marks is constructed of a highly reflective aluminum (Al), usually of an L- or I-shaped convex planar form. A field region with no opaque layer surrounds each of the position-alignment marks, thus forming a background to it.

The device pattern is scanned with the laser beam along the x-axis or along the y-axis of the design-basis coordinate system. Variation in the amount of the laser beam light reflected vertically from the aluminum layer is thus detected each time it scans a position-alignment mark and its surrounding background. The position of each of the position-alignment marks is thus detected. Then, based on the detected coordinates of the position-alignment marks, the device pattern's position is adjusted so that the apparatus-basis coordinate system precisely coincides with the design-basis coordinate system of the device pattern.

In general, the aluminum layers of the position-alignment marks, as well as the field region surrounding them, are covered with a film such as phosphosilicate glass or plasma nitride. Thus, since the aluminum layers and the field region or field oxide film are covered with a film, the laser beam light is also reflected vertically by the film. Since the laser beam light is coherent, the vertically reflected laser beam lights from the aluminum layer and from its cover film, as well as those from the field oxide film and from its cover film, interfere with each other. Consequently, the vertical reflectance ratios of each of the aluminum layers and the field region or field oxide film depends on the thickness of the cover film from which the laser beam light is reflected. With a certain thickness of cover film, the reflectance ratio of the aluminum layer may be substantially identical to that of the film oxide layer so that the contrast between each of the position-alignment marks and its background is considerably weakened, thus making it impossible to perform a precise position alignment of the device pattern.

To eliminate this possibility, in the conventional method, the cover film deposited on the aluminum film is removed by etching. However, the conventional method is disadvantageous in that each of the position-alignment marks is restricted to a predetermined position some 100 μm away from active region within the device pattern.

SUMMARY OF THE INVENTION

It is an object of the present invention to provide a position-alignment mark and a laser trimmer using said position alignment mark which is widely used in a semiconductor device fabrication process, and a semiconductor device manufacturing process. The position alignment mask makes a considerable difference in amount between a laser beam light reflected vertically from the position-alignment mark and that reflected from the background thereof to strengthen a contrast between the position-alignment mark and the background surrounding the mark, so that a signal-to-noise ratio (SN ratio) is considerably improved to enable a precise position alignment to be performed.

A feature of the present invention resides in accomplished by providing a position-alignment mark comprising a reflecting region for vertically reflecting a position detecting light, and a low-reflectance region having low reflectance to vertically incident light for scattering the position detecting light to reduce the amount of light reflected vertically.

Another feature of the present invention resides in a position-alignment mark comprising a low-reflectance region having low reflectance to vertically incident light provided with a concave-convex portion for scattering the position detecting light to reduce the amount of light reflected vertically, and a reflecting region provided with a plane portion for vertically reflecting said position detecting light.

Still another feature of the present invention resides in a semiconductor device provided with a position-alignment mark formed by patterning a light reflecting layer, wherein said pattern-alignment mark comprises a target pattern for reflecting position detecting light, and a plurality of smaller patterns than said target pattern, said light reflecting layer being covered with a covering layer where vertically incident light scatters on said plurality of patterns.

Further feature of the present invention resides in a laser trimmer comprising a laser-beam light projecting means for projecting a laser-beam light onto a semiconductor device on a stage, provided with position alignment mark provided with a reflecting region for vertically reflecting said laser-beam light and a low-reflectance region formed near said reflecting region, having low reflectance for scattering said laser-beam light to reduce the amount of light reflected vertically, a measuring means for measuring the intensity of vertically reflected light reflected from said position alignment mark, a memory means for storing test and design data of said semiconductor device, an arithmetic processing means for determining a trimming position of said semiconductor device on a device coordinate system on the basis of the amount of said vertically reflected light and said test and design data, and a stage driving means for driving said stage.

Still further feature of the present invention resides in a laser trimmer comprising a laser-beam light projecting means for projecting a laser beam light onto a chip of a semiconductor device mounted on a stage, said chip being provided with position-alignment mark comprising a low-reflectance region having low reflectance for scattering a laser beam to reduce the amount of light reflected vertically, a vertically reflecting region, mounted near said low-reflectance region, for reflecting a laser beam vertically, a measuring means for measuring the intensity of vertically reflected light reflected from said position-alignment mark, a memory means for storing test and design data of said semiconductor device, and an arithmetic processing means for determining a trimming position of said semiconductor device on a device coordinate system on the basis of the amount of said vertically reflected light and said test and design data, and a stage driving means for driving said stage.

Still further feature of the present invention resides in a semiconductor device manufacturing process comprising a process of forming a fuse portion on a semiconductor substrate, a light reflecting layer forming process for forming a layer in the region other than said fuse portion, a process for forming a reflecting region by patterning said light reflecting layer to vertically reflect the position detecting light, a low-reflectance region having low reflectance, having a plurality of smaller patterns than said reflecting region, and scattering said position detecting light to reduce the amount of light reflected vertically, a forming process of a covering layer on said reflecting region and low-reflectance region having low reflectance to vertically incident light, a process of calculating the position of a fuse according to the basic point obtained with the amount of light reflected vertically by projecting position detecting light vertically on said reflecting region and low reflectance region having low reflectance to vertically incident light, a cutting process by projecting a laser light on said fuse.

Still further feature of the present invention resides in a semiconductor device manufacturing process comprising a process of forming a fuse on a semiconductor substrate, a process of forming a position-alignment mark in the region other than said fuse portion provided with a vertically reflecting region comprising a concave-convex portion for scattering said position detecting light to reduce the amount of light reflected vertically and a plane portion for reflecting said position detecting light vertically, a process of forming a covering layer on said position-alignment mark, an arithmetic processing means for determining a fuse position on the device coordinate system on the basis of the intensity of vertically incident light reflected from said position-alignment mark by vertically projecting a laser beam on a semiconductor device provided with a position-alignment mark, and a cutting process by projecting a laser beam on said fuse.

The position-alignment mark of the present invention is advantageous in that it makes a considerable difference in the amount of light reflected vertically from the position detecting target and the background surrounding the target therebetween to strengthen the contrast therebetween.

In addition, laser trimmer used in the semiconductor device manufacturing process is advantageous in that there is no fear of failure of the laser trimming operation, because the coordinates of each of the position-alignment marks are determined on the basis of the apparatus-basis coordinate system in accordance with variations of the laser beam light reflected from the position-alignment marks to make it possible to calculate a conversion coefficient for converting the design-basis coordinate system into the apparatus-basis coordinate system, so that a trimming position is precisely determined to enable the laser beam light to be precisely projected.

The above object, additional objects, additional embodiments and additional advantages of the present invention will be clarified to those skilled in the art hereinbelow with reference to the following description and accompanying drawings illustrating preferred embodiments of the present invention according to principles of the present invention.

BRIEF DESCRIPTION OF THE DRAWINGS

FIG. 6A shows an L-shaped target pattern, FIG. 6B shows an I-shaped target pattern, FIG. 6C shows a II-shaped target pattern, and FIG. 6D shows a cross-shaped or +-shaped target pattern;

FIGS. 7A' to 7C' are graphs which show measured of reflectance ratio with the surface of the conventional position-alignment mark having no low-reflectance region, i.e., having no light-scattering pattern, in FIGS. 7A and 7A', the cover film of the mark is of a standard thickness, in FIGS. 7B and 7B', the cover film of the mark has a thickness 0.1 microns less than the standard value, in FIGS. 7C and 7C', the cover film of the mark has a thickness 0.1 microns more than the standard value;

DESCRIPTION OF THE PREFERRED EMBODIMENTS

Hereinbelow, preferred embodiments of the present invention are described in detail with reference to the accompanying drawings.

Figure 1A:
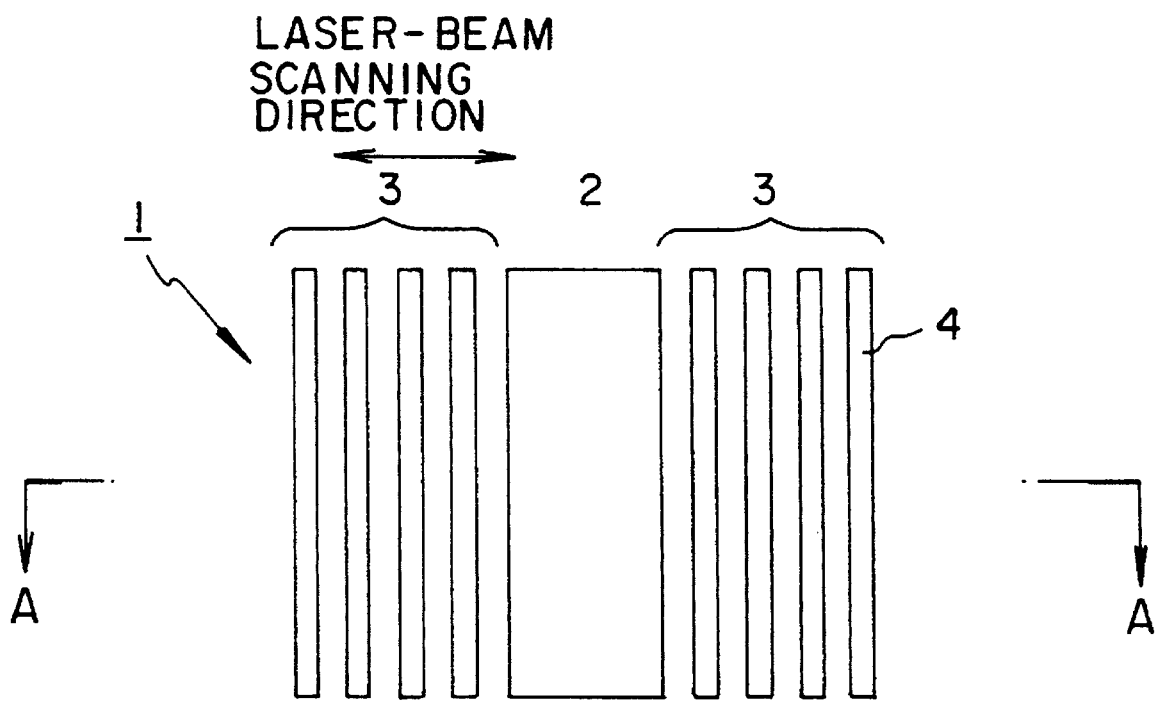
FIG. 1A is a plane view of a first embodiment of the position-alignment mark of the present invention.
Figure 1B:
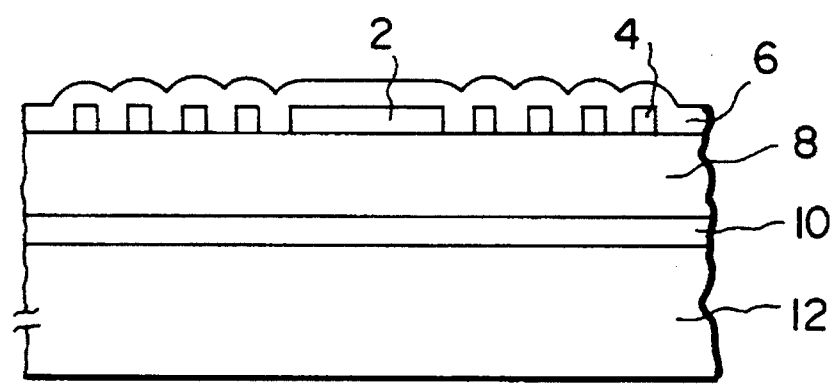
FIG. 1B is a cross-sectional view of the first embodiment of the position-alignment mark of the present invention shown in FIG. 1A.

FIGS. 1A and 1B show a plane view and a cross-sectional view, respectively, of a first embodiment of a position-alignment mark 1 of the present invention. The cross-sectional view, i.e., FIG. 1B, is taken along the line A—A of FIG. 1A.

As shown in FIG. 1B, a field oxide film 10 is formed on a semiconductor or silicon substrate 12. On oxide film 10 is formed a PSG layer 8 on which are formed a position-detecting target 2 and a pair of low-reflectance regions 3 which sandwich the target 2 therebetween. The position-alignment mark 1 is constructed of the position-detecting target 2 and the low-reflectance regions 3. The position-detecting target 2 and the low-reflectance regions 3 extend perpendicular to the laser-beam scanning direction. The position-detecting target 2 is of a predetermined width in the laser-beam scanning direction. This width is substantially 2 times the diameter of a projected laser spot formed by a laser beam. Each of the low-reflectance regions 3 is constructed of a plurality of strip-like aluminum layers 4 extending perpendicular to the laser-beam scanning direction. Each of the aluminum layers 4 is of a predetermined width which is less than a third of the diameter of the projected laser spot, i.e., less than 2 microns in the laser-beam scanning direction. These aluminum layers 4 are spaced apart from each other at intervals of less than a half of the projected laser spot, i.e., at intervals of less than 3 microns.

As shown in FIG. 1B, a cover film 6 such as a PSG film or a plasma nitride film is formed on the position-detecting target 2 and the low-reflectance regions 3. The cover film 6 formed on the low-reflectance regions 3 assumes a concave-convex shape in cross section, as is clear from FIG. 1B. Although a width of the cover film 6 is suitably about a half of the internal of the aluminum layers 4, it may also be substantially identical to this interval.

With this embodiment of the position-alignment mark 1 is employed a laser-beam light source which projects an infrared laser beam light having a wavelength of from 1030 to 1060 nanometers, a projected laser spot with a diameter of 6 microns. Consequently, with this embodiment of the position-alignment mark 1 the position-detecting target 2 has a width of 12 microns in the laser-beam scanning direction; each of the strip-shaped aluminum layers 4 has a width of a sixth of the diameter of the projected laser spot, or 1 micron, in the laser-beam scanning direction; the interval between the aluminum layers 4 in the laser-beam scanning direction is about a fourth of the diameter of the projected laser spot, or about 1.4 microns; and the thickness of the cover film 6 is a half of the interval between the aluminum layers 4, or 0.7 microns.

The operation is described as follows.

When the laser beam light used for detecting a position of the position-alignment mark 1 is projected onto the low-reflectance regions 3, it is reflected from both the cover film 6 and the stripe-shaped aluminum layers 4. The surface of the cover film 6 formed on the low-reflectance regions 3 is caused to assume a concave-convex shape by stripe-shaped aluminum layers 4. Thus, the laser beam light reflected by this surface and edge portions of the aluminum layers 4 is scattered so that the amount of laser-beam light reflected vertically from the low-reflectance regions 3 is considerably reduced. In addition, since the widths of the stripe-shaped aluminum layers 4 are much smaller than the diameter of the projected laser spot formed by the laser beam light, the amount of laser beam light reflected from the edge portions of the aluminum layers 4 is much larger than that from planar portions of the aluminum layers 4. Thus, the reflectance ratio of each of the low-reflectance regions 3 is reduced.

When the laser beam light reaches the position-detecting target 2 of the position-alignment mark 1, it is vertically reflected from the target 2, which has a very wide planar area relative to the diameter of the projected laser spot formed by the laser beam light. Thus, the amount of laser beam light reflected from the target 2 is very large. Therefore, the reflectance ratio of the target 2 is large. The laser beam light is also reflected from the cover film 6 formed on the target 2. The amount of laser beam light reflected from the cover film 6 depends on a thickness of the cover film 6. However, the amount is so small that it does not weaken the contrast in intensity of light between the target 2 and the low-reflectance regions 3. As described above, the position-alignment mark 1 makes a considerable difference in vertically reflected light between the target 2 and the low-reflectance regions 3 to strengthen the contrast between the target 2 and the low-reflectance regions 3, thereby permitting the position-alignment mark 1 of the present invention to obtain a sharp reflectance-ratio waveform of the laser beam light.

Further, the first embodiment of the position-alignment mark 1 is characterized in that the high-reflectance aluminum layers 4 are used to form the concave-convex profile of the cover film 6. By forming the aluminum layers 4 in the same layer as the position-detecting target 2, the low-reflectance regions 3 and the position-detecting target 2 can be formed in the same process, thus reducing errors in the semiconductor-device fabrication process.

In addition, the aluminum layers 4 can be made thicker than any other material layer. Therefore, the concave-convex portions of the cover film 6 can be made with a small radius of curvature. A polycrystalline silicon layer cannot be formed more than approximately 0.5 microns thick. However, the aluminum layer can be formed up to about 1 micron thick. Consequently, the surface of the cover film 6 can effectively scatter the incident laser beam light. Therefore, there is no problem even when high-reflectance aluminum layers 4 are used in the position-alignment mark 1. In this case, the aluminum layers 4 produce a rather advantageous effect.

Figures 2A, 2B:
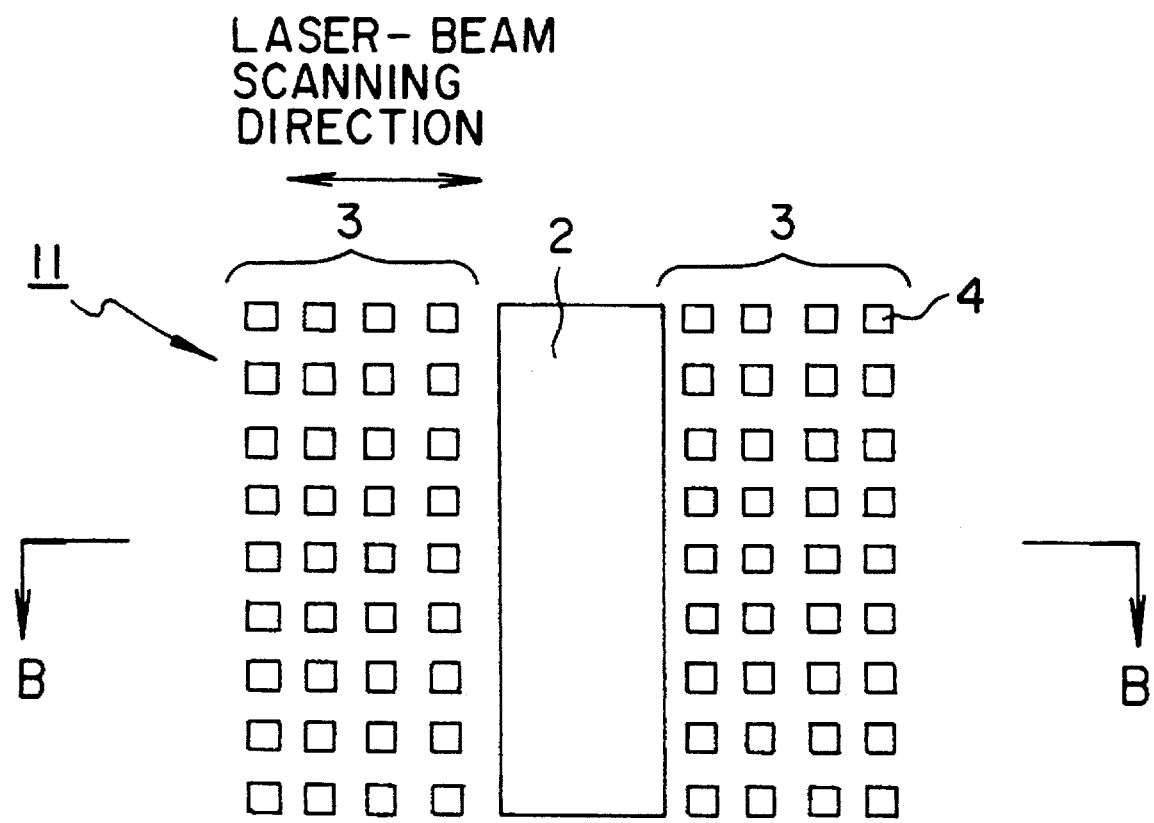
FIG. 2A is a plane view of a second embodiment of the position-alignment mark of the present invention.
FIG. 2B is a cross-sectional view of the second embodiment of the position-alignment mark of the present invention shown in FIG. 2A.

FIGS. 2A and 2B are respectively a plane view and a cross-sectional view of a second embodiment of the position-alignment mark 11 of the present invention. The cross-sectional view of FIG. 2B is taken along the line B—B of FIG. 2A.

The second embodiment of the position-alignment mark 11 of the present invention is characterized in that the low-reflectance regions 3 of the position-alignment mark 11 are constructed of a plurality of dot-like aluminum layers 4. Thus, the total plan area of the low-reflectance regions 3 of this embodiment is smaller than that of the low-reflectance regions 3 of the first embodiment shown in FIG. 1A, since the latter are formed of a plurality of the stripe-like aluminum layers 4 as shown in FIG. 1A. However, the former have a larger number of edge portions, i.e., its low-reflectance regions 3 are larger. In addition, the former has a larger number of concave-convex portions in the cover film 6 formed on the low-reflectance regions 3. Consequently, the low-reflectance regions 3 of the position-alignment mark 11 of the second embodiment have an inferior reflectance ratio. Thus, the difference in reflectance ratio between the position-detecting target 2 and the low-reflectance regions 3 of the position-alignment mark 11 of the second embodiment is greater than that in the first embodiment.

In the position-alignment mark 11 of the second embodiment the width of the dot-like aluminum layers 4 is less than a third of the diameter of the projected laser spot, or less than 2 microns in the laser-beam scanning direction; and the interval between the dot-like aluminum layers 4 is less than half of the diameter of the projected laser spot, or less than 3 microns in the laser-beam scanning direction. This is similar in the first embodiment.

Figure 3:
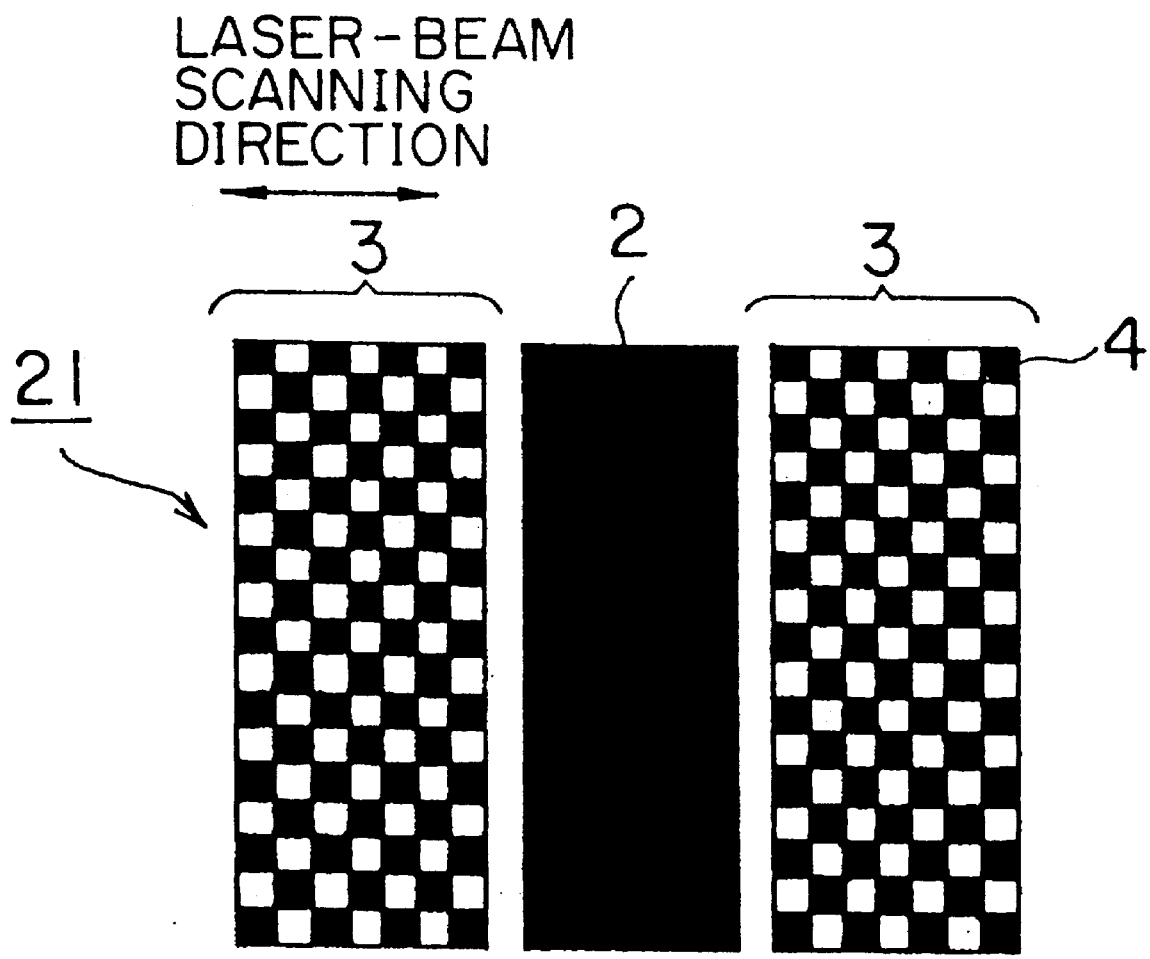
FIG. 3 is a plane view of a third embodiment of the position-alignment mark of the present invention.

FIG. 3 is a plane view of a third embodiment of the position-alignment mark 21 of the present invention.

The third embodiment is characterized in that each of the low-reflectance regions 3 of the position-alignment mark 21 is constructed of a plurality of aluminum layers 4 disposed in a checkerboard configuration as shown in FIG. 3. These aluminum layers 4 may provide substantially the same lower-reflectance effect as that provided by the dot-like aluminum layers 4 of the second embodiment of the position-alignment mark 11 relative to the stripe-like aluminum layers 4 of the first embodiment of the position-alignment mark 1.

In FIG. 3, the black spots appearing in the low-reflectance regions 3 of the position-alignment mark 21 represent the aluminum layers 4 and the white spots represent the intervals between them.

Figure 4A:
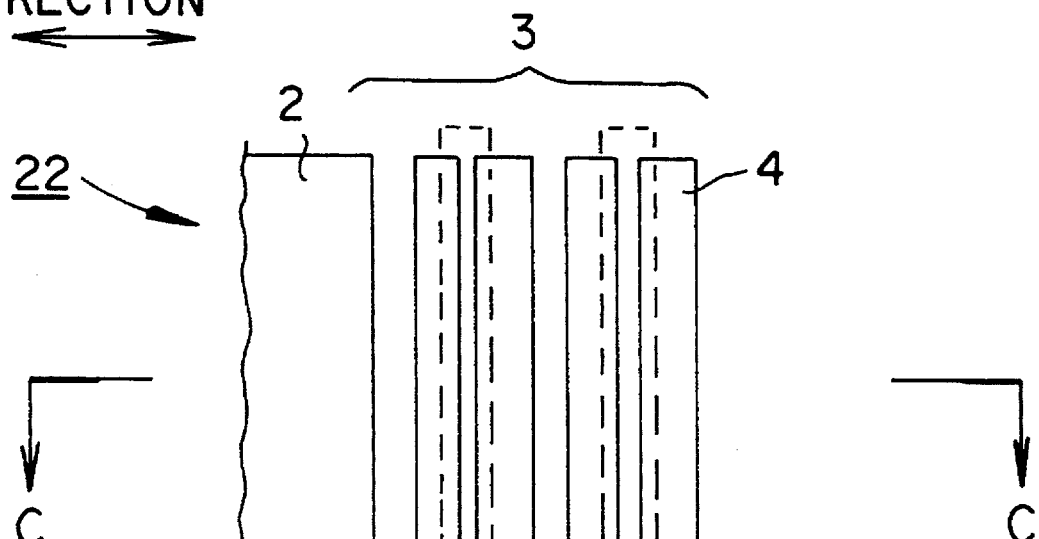
FIG. 4A is a plane view of a fourth embodiment of the position-alignment mark of the present invention.
Figure 4B:
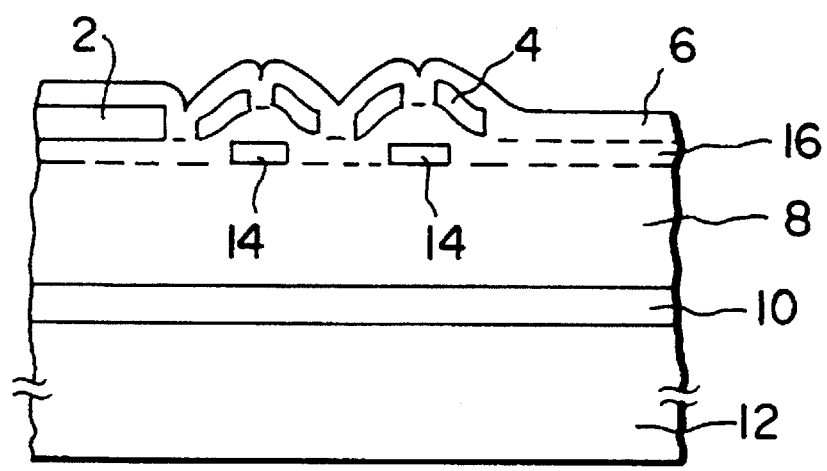
FIG. 4B is a cross-sectional view of the fourth embodiment of the position-alignment mark of the present invention shown in FIG. 4A.

FIGS. 4A and 4B are respectively a plane view and a cross-sectional view of a fourth embodiment of the position-alignment mark 22 of the present invention. The cross-sectional view of FIG. 4B is taken along the line C—C of FIG. 4A.

As is clear from FIG. 4B, in the fourth embodiment of the position-alignment mark 22, shoulder-forming aluminum layers 14 are formed on a first phosphosilicate glass layer 8, and a phosphosilicate glass layer 16 is formed on these shoulder-forming aluminum layers 14. Further, the position-detecting target 2 and the stripe-like aluminum layers 4 are formed on the second PSG layer 16. In this construction, the shoulder-forming aluminum layers 14 cause the stripe-like aluminum layers 4 to form oblique layers.

Finally, the cover film 6 is formed on the position-detecting target 2 and the stripe-like aluminum layers 4. The shoulder-forming aluminum layers 14 cause the surface of the cover film 6 formed on the stripe-like aluminum layers 4 to be formed with stripe-like concave portions corresponding to the intervals between the stripe-like aluminum layers 4.

The fourth embodiment of the position-alignment mark 22 of the present invention is characterized in that the low-reflectance regions 3 of the position-alignment mark 22 are constructed such that the cover film 6 has a plurality of stripe-like concave portions, thus considerably reducing the amount of laser-beam light reflected from the low-reflectance regions 3 of the position-alignment mark 22.

Figure 5A:
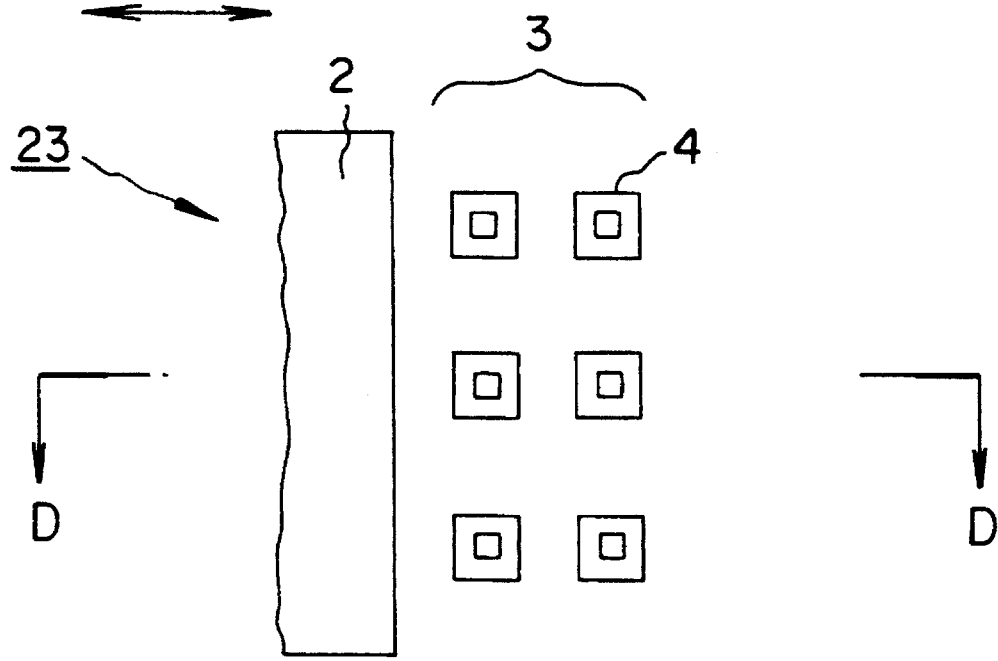
FIG. 5A is a plane view of a fifth embodiment of the position-alignment mark of the present invention.
Figure 5B:
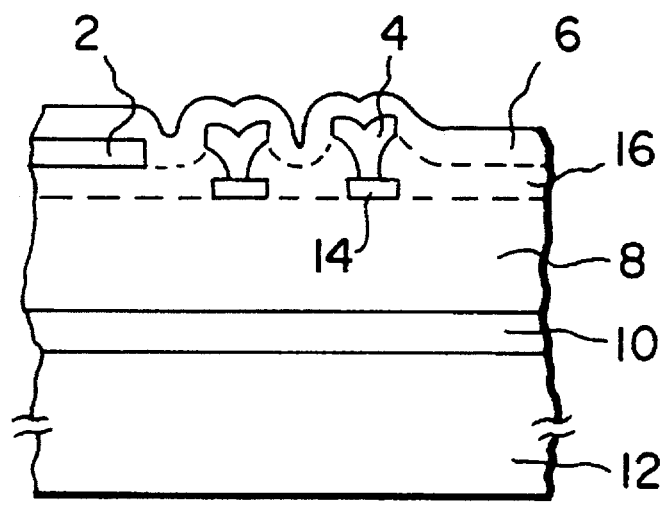
FIG. 5B is a cross-sectional view of the fifth embodiment of the position-alignment mark of the present invention shown in FIG. 5A.

FIG. 5A and 5B are respectively a plane view and a cross-sectional view of a fifth embodiment of the position-alignment mark 23 of the present invention. The cross-sectional view of FIG. 5B is taken along the line D—D of FIG. 5A.

As is clear from FIG. 5B, in this embodiment the shoulder-forming aluminum layers 14 are formed on the phosphosilicate glass layer 8, the phosphosilicate glass layer 16 is formed on these shoulder-forming aluminum layers 14, and contact holes are formed in the phosphosilicate glass layer 16. Further, the position-detecting target 2 and concave aluminum layers 4 are formed on the phosphosilicate glass layer 16. These portions are partially received in the contact holes of the phosphosilicate glass layer 16 to bring then into contact with the shoulder-forming layers 14. The concave aluminum layers 4 have a control concave portions resulting from the contact holes formed in the PSG layer 16. These central concave portions and edge portions of the concave aluminum layers 4, together with the intervals between these concave aluminum layers 4, produces substantially curved profiles in the cover film 6 finally formed on the position-detecting target 2 and the concave aluminum layers 4 over the low-reflectance regions 3 of the position-alignment mark 23.

Consequently, the fifth embodiment of the position-alignment mark 23 of the present invention is characterized by such a curved surface of the cover film 6 in each of the low-reflectance regions 3 of the position-alignment mark 23. This curved surface contributes to a considerable reduction in the amount of laser-beam light reflected from the low-reflectance regions 3 of the position-alignment mark 23.

Incidentally, in the above construction, the concave (aluminum) layers 4 or the layers 14 may be made of any other suitable material such as polycrystalline silicon and phosphosilicate glass. In this case, there is substantially no fear that such other material will impair the effect of the present invention.

Figure 6B:
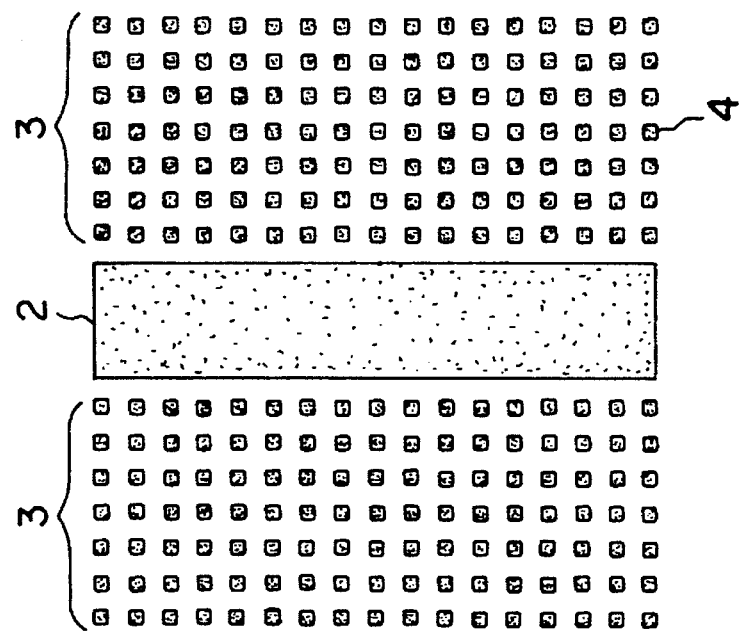
FIGS. 6A to 6D are plane views of pattern examples of the position detecting target of the position-alignment mark of the present invention.
Figure 6A:
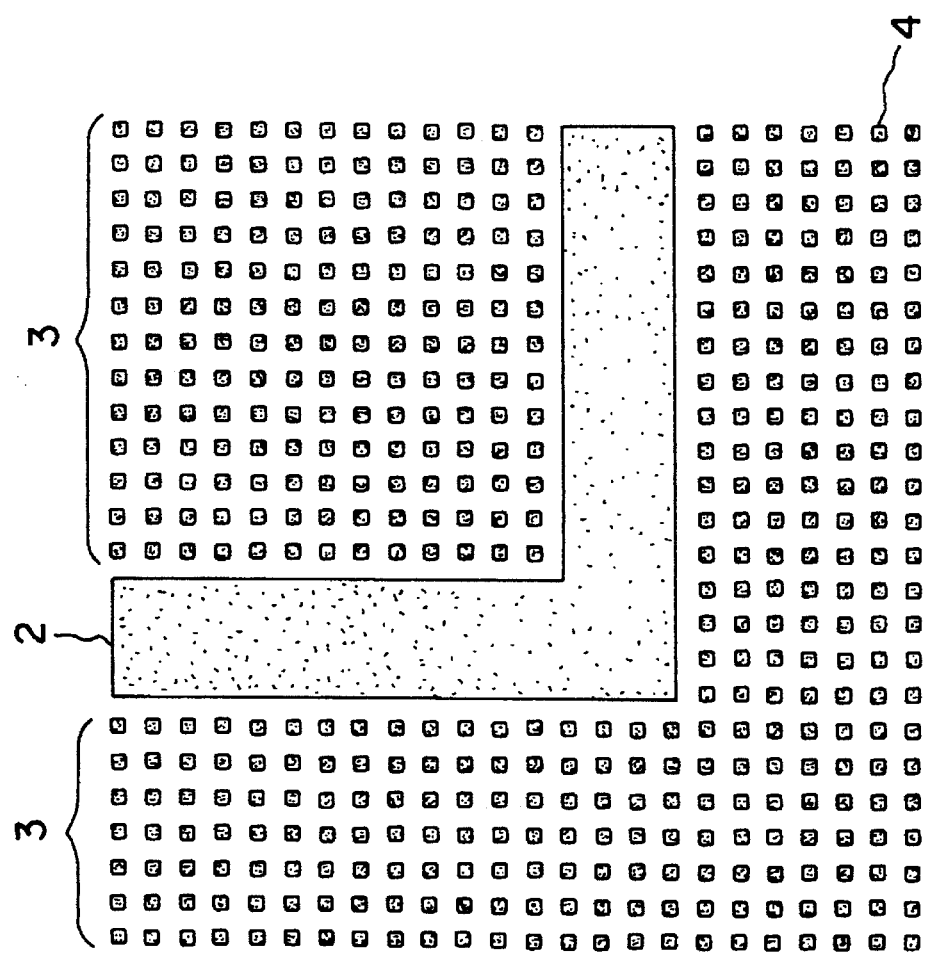
Figure 6D:
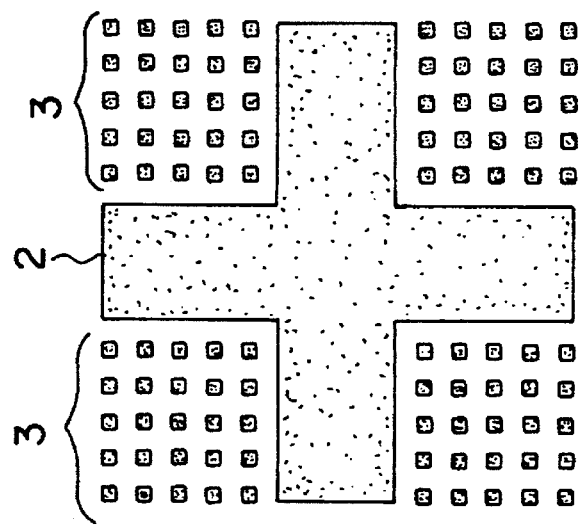
Figure 6C:
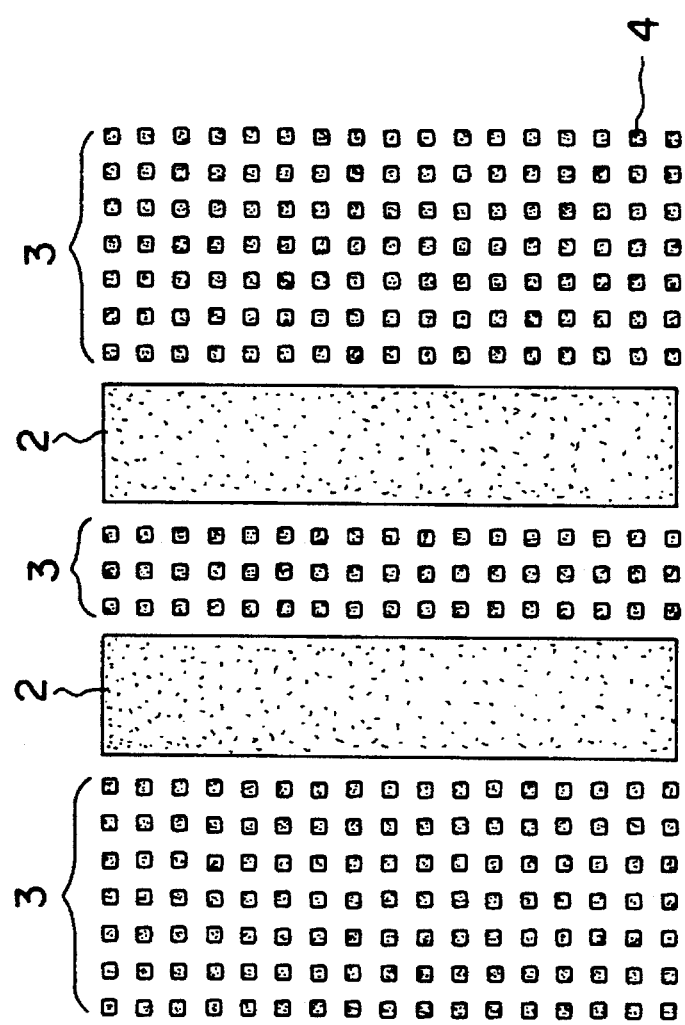

FIGS. 6A to 6D are plane views of examples of target patterns of the position-detecting target 2 of the position-alignment mark 11 of the second embodiment of the present invention shown in FIGS. 2A and 2B, illustrating the dot-like aluminum layers 4 surrounding various shapes of the position-detecting target 2. FIG. 6A shows an L-shaped target pattern, FIG. 6B shows an I-shaped target pattern, FIG. 6C shows a II-shaped target pattern, and FIG. 6D shows a cross-shaped or +-shaped target pattern of the position-detecting target 2 of the position-alignment mark 11 of the second embodiment.

Figure 7A:
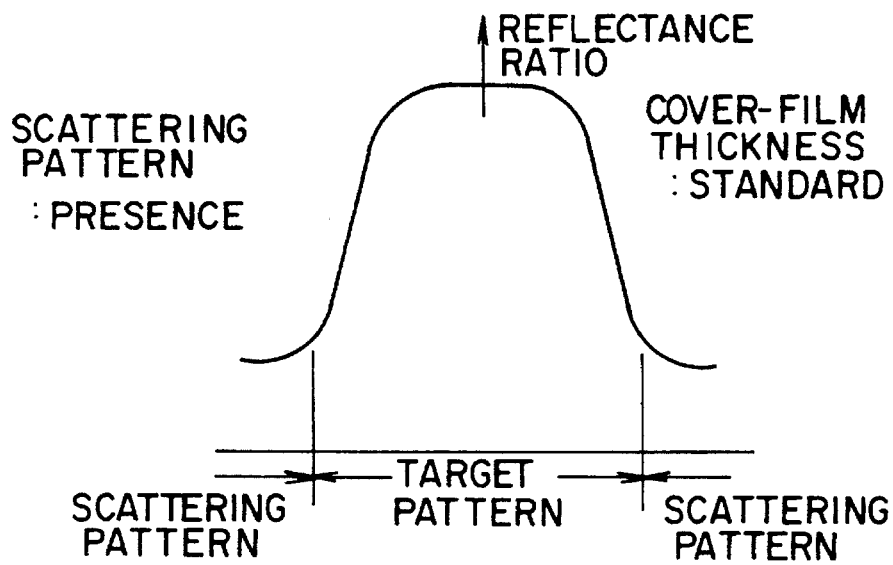
FIGS. 7A to 7C are graphs which show measured of reflectance ratio with the surface of the position-alignment mark having the low-reflectance regions or light-scattering patterns of the present invention.
Figure 7B:
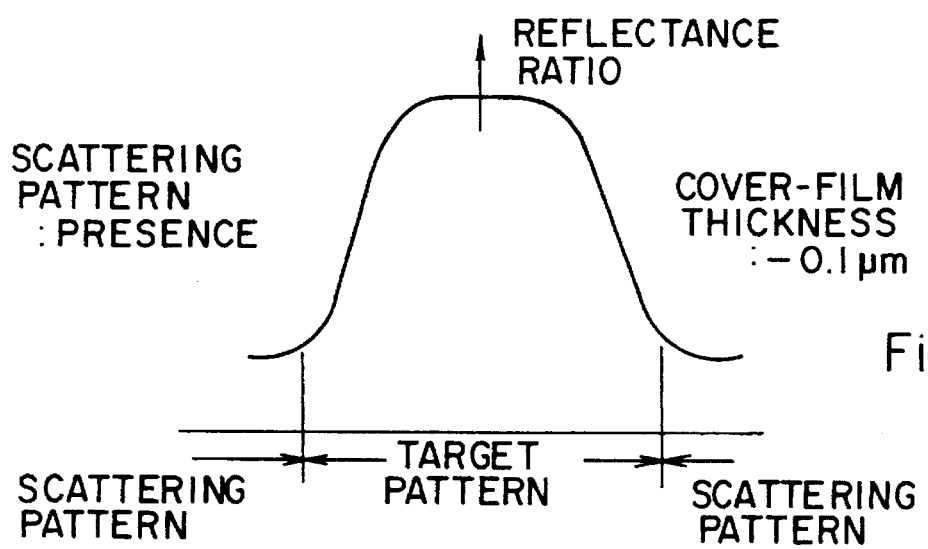
Figure 7C:
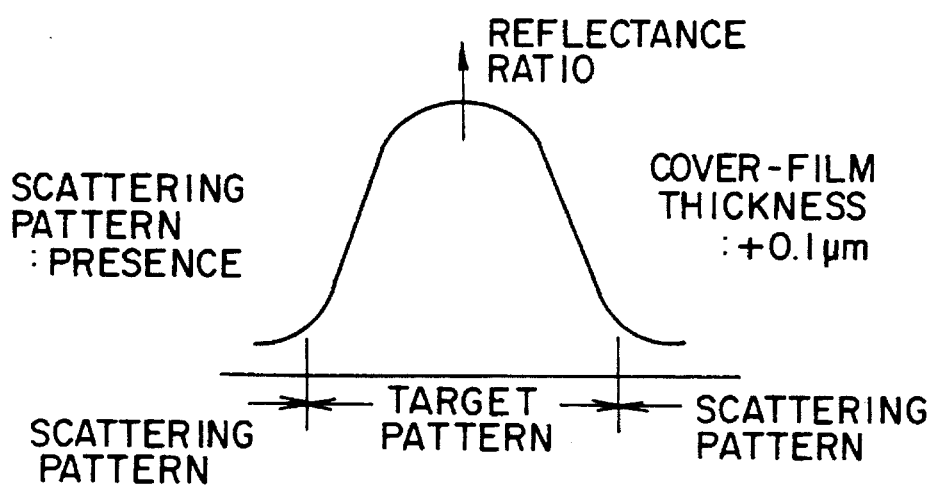

FIGS. 7A to 7C show measured reflectance-ratio data graphs of the position-alignment marks of the present invention, and FIG. 7A' to 7C' show measured reflectance-ratio data graphs of the position-alignment marks of the conventional type. As shown, in each of the position-alignment marks shown in FIGS. 7A and 7A', the cover film of the mark is of a standard thickness; in each of the position-alignment marks shown in FIGS. 7B and 7B', the cover film of the mark has a thickness 0.1 microns less than the standard value; and in each of the position-alignment marks shown in FIGS. 7C and 7C', the cover film of the mark has a thickness 0.1 microns more than the standard value.

As is clear from the graphs in FIGS. 7A to 7C, the thickness of the cover film of the position-alignment mark of the present invention exerts substantially no influence on the reflectance ratio of the mark regardless the variation of the thickness of the cover film of the mark, thus permitting a contrast between the low-reflectance regions 3 or scattering pattern regions and the position-detecting target 2 or target pattern region of the mark to be strengthened. In contrast with this, as is clear from the graphs in FIG. 7A' to 7C', the conventional position-alignment mark having no scattering pattern weakens the contrast between the low-reflectance regions or silicon oxide ($SiO_2$) fields and the position-detecting target or target pattern region of the mark regardless of the thickness of the cover film of the mark.

Figure 8A:
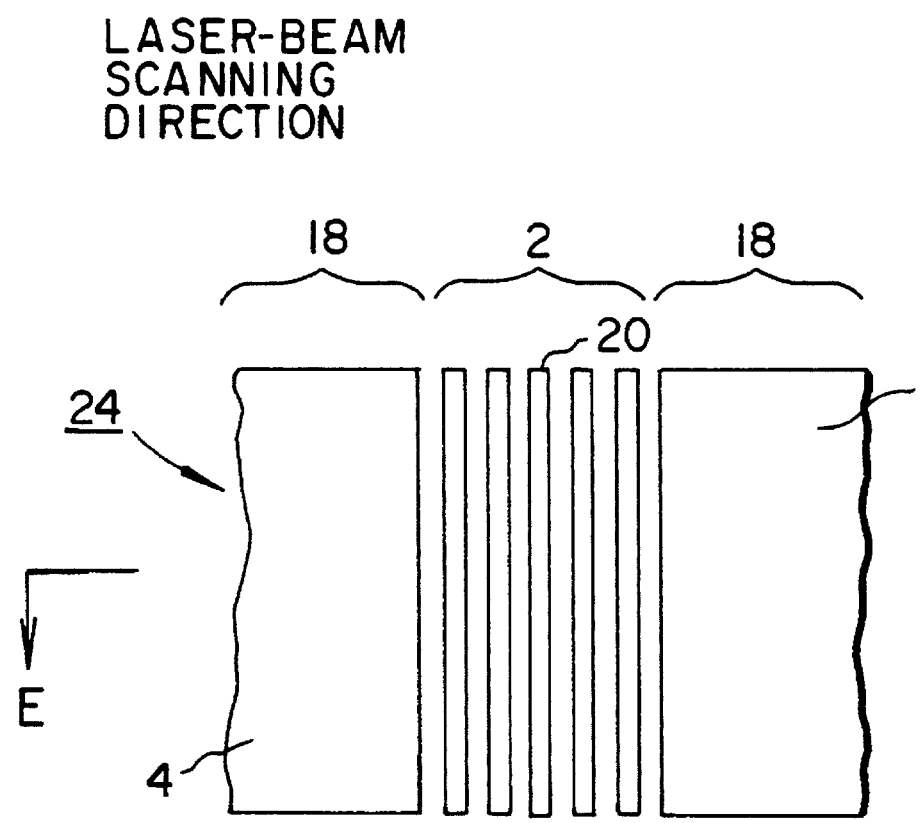
FIG. 8A is a plane view of a sixth embodiment of the position-alignment mark of the present invention.
Figure 8B:
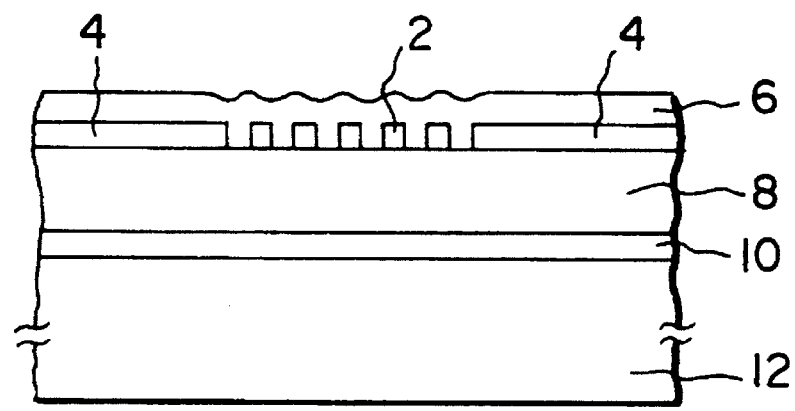
FIG. 8B is a cross-sectional view of the sixth embodiment of the position-alignment mark of the present invention shown in FIG. 8A.

FIGS. 8A and 8B are respectively a plane view and a cross-sectional view of a sixth embodiment of the position-alignment mark 24 of the present invention. The cross-sectional view of FIG. 8B is taken along the line E—E of FIG. 8A.

As is clear from FIG. 8B, in the sixth embodiment of the position-alignment mark 24, the PSG layer 8 is formed on a field oxide film 10. Further, the position-detecting target 2 and high-reflectance regions 18 which sandwich the target 2 therebetween are formed on the phosphosilicate glass layer 8. The position-detecting target 2 of the mark 24 is constructed of a plurality of stripe-like aluminum layers 20 extending perpendicular to the laser-beam scanning direction. Each of the high-reflectance regions 18 of the mark 24 has a width about two times greater than the diameter of the projected laser spot in the laser-beam scanning direction. The cover film 6 made of PSG is formed on the position-detecting target 2 and high-reflectance regions 18. The stripe-like aluminum layers 20 cause the surface of the cover film 6 formed on the layers 20 to assume a concave-convex profile, as shown in FIG. 8B.

Next, operation is described.

When the laser beam light is projected onto the high-reflectance regions 18 of the mark 24 in its scanning operation, it is reflected vertically at a high reflectance ratio.

However, when the laser beam light is projected onto the position-detecting target 2 of the mark 24 in its scanning operation, it is reflected by both the cover film 6 and the stripe-like aluminum layers 20. Since the surface of the cover film 6 formed on the stripe-like aluminum layers 20 of the mark 24 has a concave-convex shape, the incident laser-beam light is scattered by the concave-convex surface of the cover film 6 and the edge portions of the aluminum layers 20. Thus, the amount of vertically reflected light is considerably reduced in the mark 24. In other words, since each of the stripe-like aluminum layers 20 of the mark 24 has a width which is much smaller than the diameter of the projected laser spot in the laser-beam scanning direction, the major part of the laser beam light projected onto the aluminum layers 20 is scattered by the concave-convex portion and the edge portions of the aluminum layers 20, so that the amount of light reflected vertically from the aluminum layers 20 of the mark 24 is much smaller than from each of the high-reflectance regions 18 of the mark 24. Thus, the contrast between the position-detecting target 2 and the high-reflectance regions 18 is considerably strengthened in the position-alignment mark 24 of the present invention.

The mark 24 of the sixth embodiment of the present invention is characterized in that the position-detecting target 2, having the concave-convex surface, scatters the major part of the incident laser beam light, thus considerably reducing the amount of light reflected vertically from the target 2; and in that the high-reflectance regions 18 effectively reflect the major part of the incident laser beam light, thus considerably increasing the amount of light reflected vertically light from the high-reflectance regions 18 of the mark 24. Thus, the sixth embodiment has the reverse effect on the laser beam light to that of the first embodiment (i.e., the target 2 of the mark 24 of the sixth embodiment has the same reflectance effect as the low-reflectance regions 3 of the mark 1 of first embodiment, while the high-reflectance regions 18 of the mark 24 have the same reflectance effect as target 2 of the mark 1 of the first embodiment). Consequently, as is clear from the above description, the position-detecting target 2 of the mark 24 may be constructed of a plurality of suitably-formed aluminum layers such as other stripe-like layers, dot-like layers and the checkerboard-disposed ones, as shown from FIGS. 3 to 5.

As described above, the sixth embodiment of the position-alignment mark 24 may sufficiently strengthen the contrast between the target 2 and the high-reflectance regions 18 regardless of variation of the thickness of the cover film 6 caused by variation in lot production, thereby permitting a precise position alignment to be accomplished in laser trimming operations. Further, the sixth embodiment of the position-alignment mark 24 may eliminate the etching process for removing the cover film formed on the conventional aluminum position-alignment pattern. The etching process was previously required to eliminate a so-called superposed reflection of light caused by variation in thickness of the cover film. The superposed reflection of light considerably weakens the contrast between the position-detecting target and the background of the position-alignment mark.

Incidentally, the position-detecting target 2 of the mark 24 of the sixth embodiment of the present invention may be suitably modified to assume any other suitable form, such as L-shaped, an I-shaped, an II-shaped, a cross-shaped or +-shaped form.

In addition, the low-reflectance regions 3 of the position-alignment mark shown in FIGS. 1 to 5 and 8, may be made of any other suitable material in addition to aluminum, provided that the material is effective in reducing the amount of light reflected vertically from the regions 3.

Further, in the second embodiment of the position-alignment mark 11 of the present invention shown in FIGS. 2A and 2B, the dot-like aluminum layers 4 may assume any other suitable form, such as a square, a circular and or rectangular form.

Now, an apparatus of the present invention for performing a laser trimming operation (hereinafter referred to as the laser-trimming apparatus) will be described in connection with an operation of cutting the portion of fuse 27 for the redundant bit 26.

Figure 9:
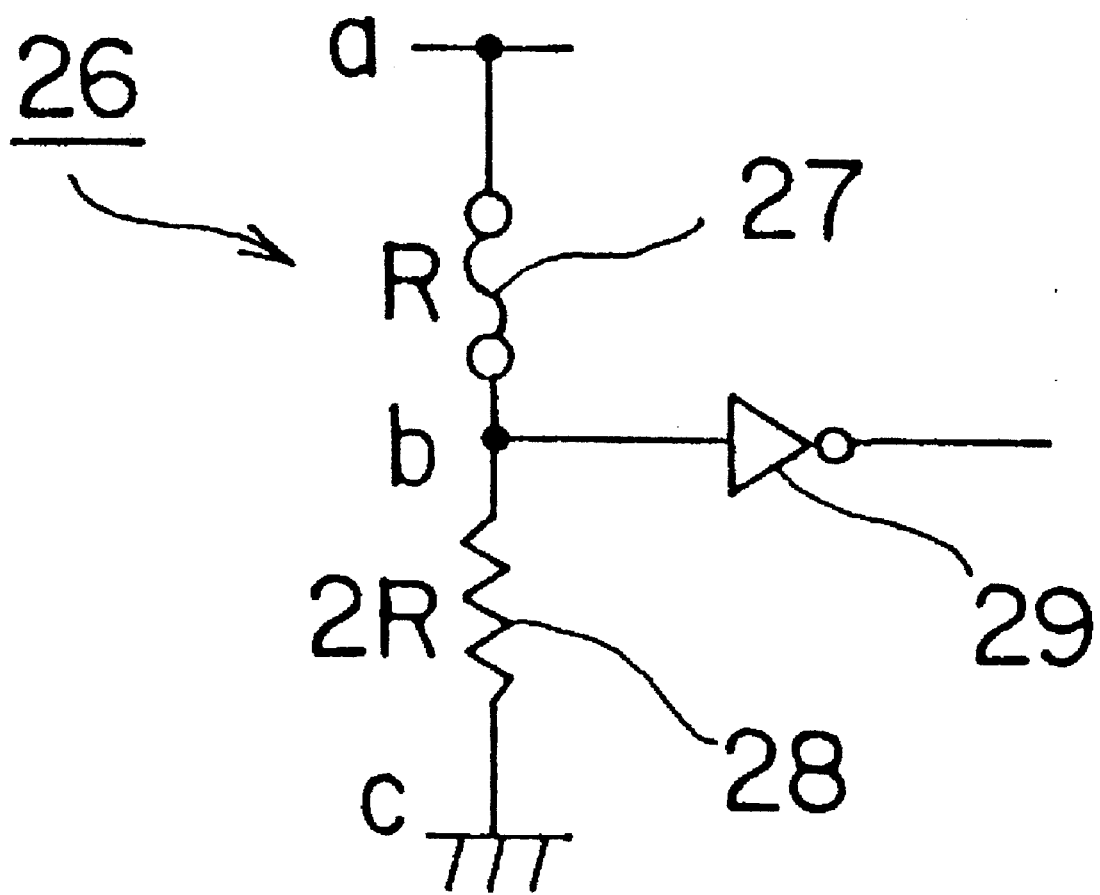
FIG. 9 is a simplified example of a circuit for a redundant bit.

FIG. 9 shows a extremely simplified example of a circuit of the redundant bit 26.

As shown in FIG. 9, the fuse 27 and a resistor 28 are connected in series between a terminal "a" and a grounded terminal c, and an intermediate junction b interposed between the fuse 27 and the resistor 28 is connected to an inverter 29. In this circuit, where the fuse 27 has a resistance of R, the resistor has a resistance of 2R, and a voltage value appearing in the terminal "a" is $V_{cc}$, the voltage at junction b is measured to be two thirds of $V_{cc}$ or $2V_{cc}/3$ and the fuse 27 is not cut. After the fuse 27 is cut, the voltage appearing at the junction b becomes zero. Consequently, it is possible for $2/3V_{cc}$ and zero to correspond to a logic value (1) and a logic value (0), respectively. Consequently, it is possible to use the cutting operation of the fuse 27 as a in step formation of an address memory ROM.

Figure 10:
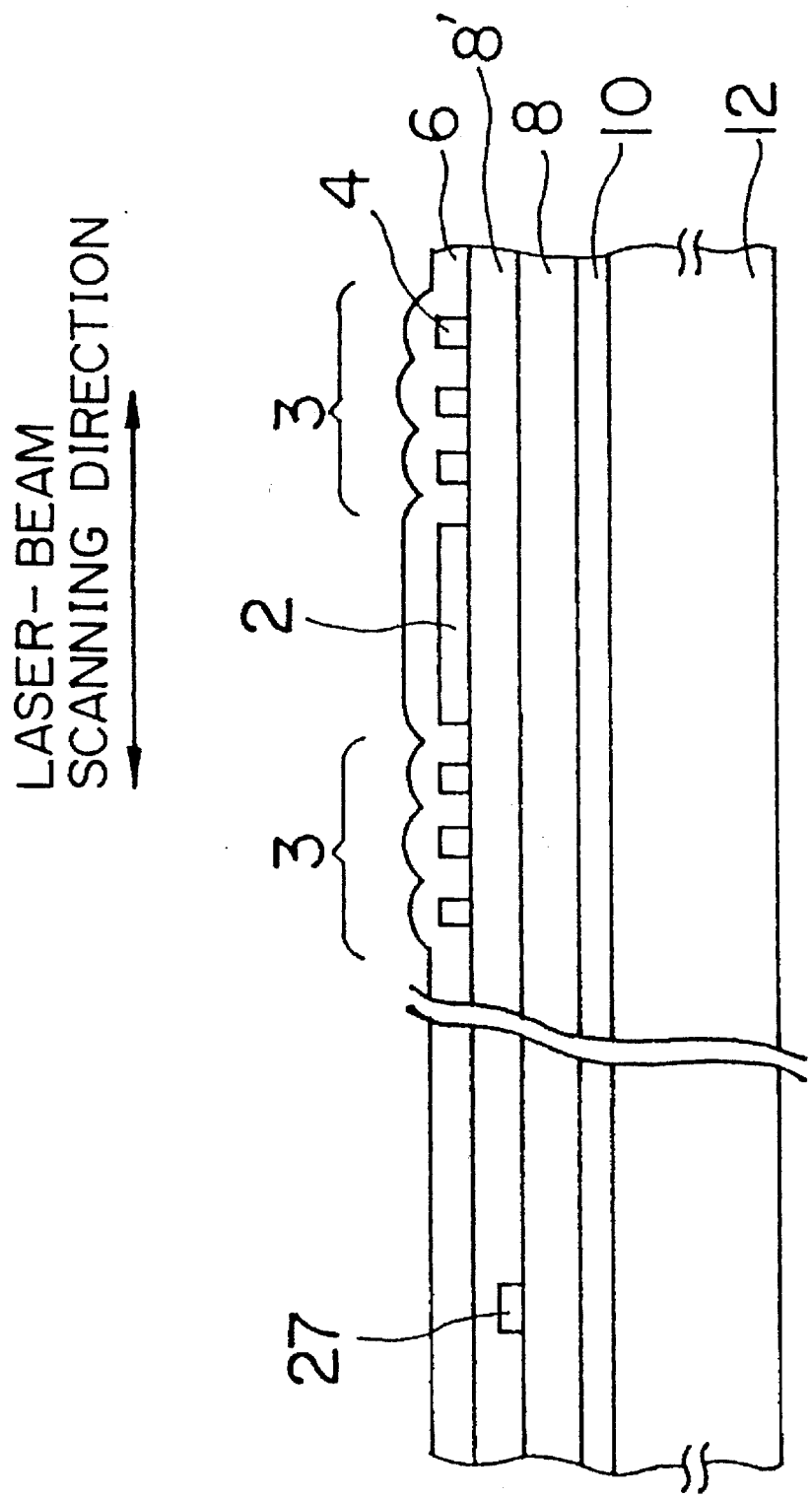
FIG. 10 is a cross-sectional view of a semiconductor device in which are formed a fuse portion used for the redundant bit and the position-alignment mark of the present invention.

FIG. 10 is a schematic cross-sectional view of a semiconductor device comprising a fuse portion 27 for a redundant bit 26 shown in FIG. 9 and the position-alignment mark of the present invention, taken along the cutting line passing through the fuse portion.

In this semiconductor device, a field oxide film 10 is formed on the semiconductor substrate 12 and a first phosphosilicate glass layer 8 is formed on the oxide film 10. A second phosphosilicate glass layer 8' is disposed on the first phosphosilicate glass layer 8 after the portion of fuse 27 for the redundant bit 26, made of polycrystalline silicon or a similar material, is formed on the first PSG layer 8. The second PSG layer 8', excluding an area corresponding to a fuse 27 for the redundant bit 26, accommodates a position-detecting target 2 formed of a planar layer having substantially the same construction as the target 2 of the position-alignment mark 1 of the first embodiment of the present invention and low-reflectance regions 3 formed of a stripe-like aluminum layer 4 which sandwich the target 2 as is in the first embodiment of the mark 1 of the present invention. The cover film 6 made of, for example, PSG or plasma nitride, is formed on the position-detecting target 2 and the low-reflectance regions 3.

Figure 11:
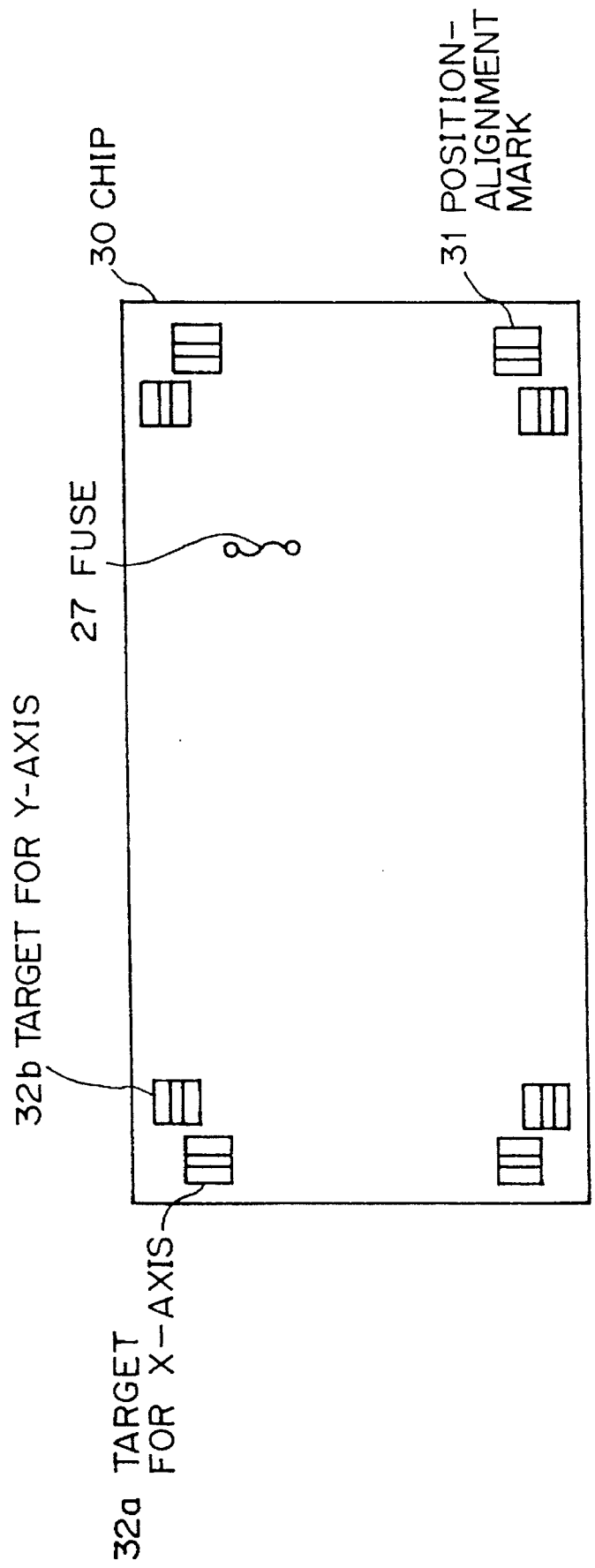
FIG. 11 is a plane view of a chip, illustrating a typical arrangement of the position-alignment marks of the present invention.

FIG. 11 shows a schematic plane view of an integrated circuit (IC) chip 30, in which the redundant bit 26 is formed; and the position-alignment marks 31 of another embodiment of the present invention are disposed.

The portion of fuse 27 for the redundant bit 26 is also shown. As is clear from FIG. 11, each of the position-alignment marks 31 is provided with an I-shaped position-detecting target 32a or 32b. Target 32a is for an x-axis (hereinafter referred to as the x-axis target 32a), while target 32b is for the y-axis (hereinafter referred to as the y-axis target 32b). A pair of x-axis targets 32a and the y-axis targets 32b are provided in each corner portion of the IC chip 30. Therefore, there are four pairs.

Figure 13:
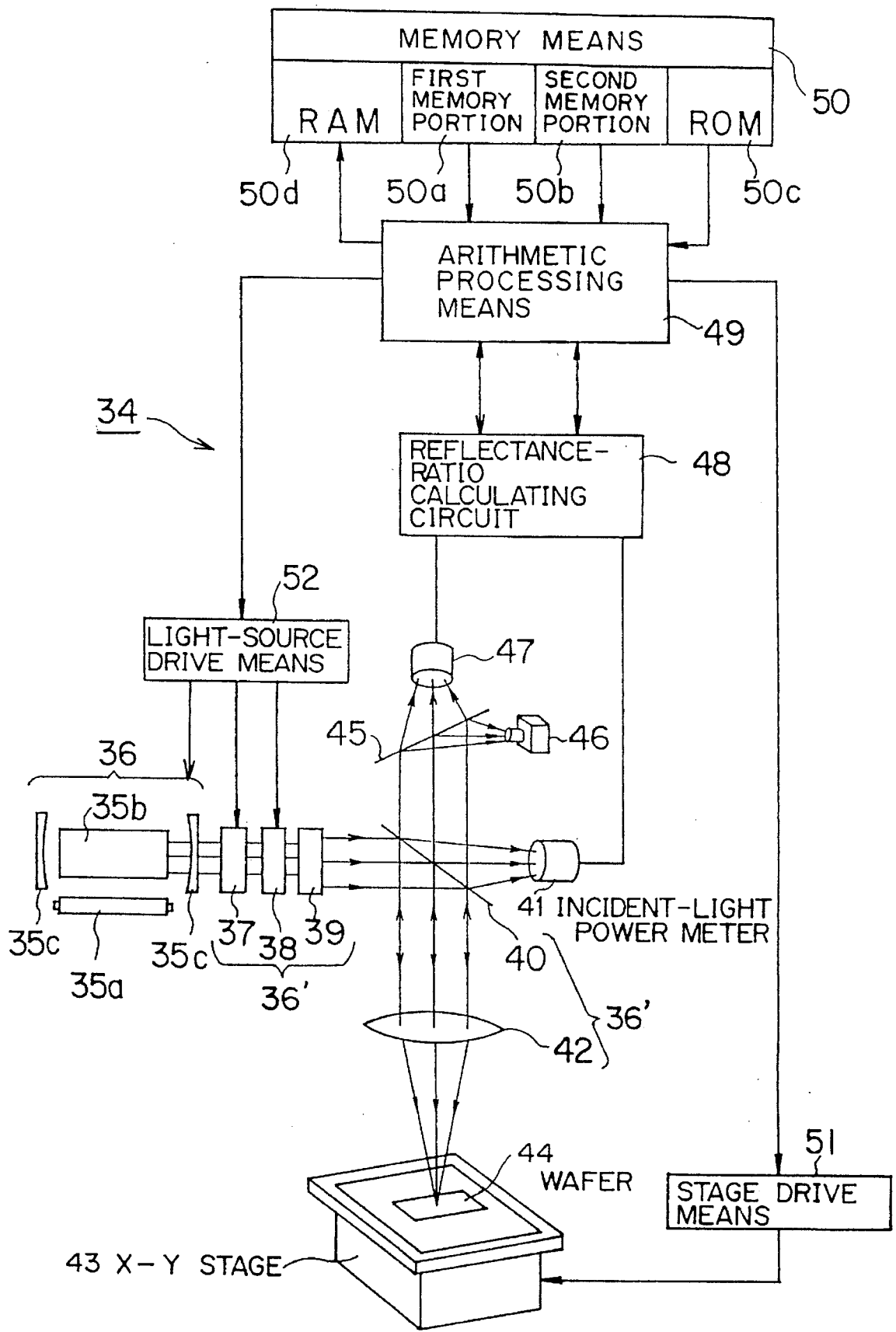
FIG. 13 is a schematic diagram of the laser trimming apparatus of an embodiment of the present invention.

FIG. 13 is a schematic diagram of an embodiment of the laser-trimming apparatus 34 of the present invention. In apparatus 34, the position-alignment marks of the present invention are used. Next, apparatus 34 is described with reference to FIG. 13.

In the laser-trimming apparatus 34 of the present invention, a laser-beam light source 36 is constructed of an excitation light source 35a such as a krypton arc lamp, a laser rod 35b made of a suitable amplifying medium such as ND/YAG (neodymium/yttrium-aluminum-garnet) crystal, and suitable mirrors 35c are forming a resonator. In operation, the laser-beam light source 36 emits a coherent light or plane wave with a high degree time- or phase-coherence. Therefore, the laser beam is highly directional. Where the fuse 27 for the redundant bit 26 is cut by operating a Q-switching element 37, the Q-switching element 37 is turned on to permit a giant pulse having a narrow pulse duration and a large peak output to be omitted. In operation, an attenuation element 38 of the laser-trimming apparatus 34 attenuates the laser beam light's intensity to such an extent that it is suitable for aligning the wafer 44, In addition, a beam expander 39 of the laser-trimming apparatus 34 converts the laser beam light from a thin flux state into a relatively thick flux state.

Further, in operation, a first semitransparent mirror 40 of the laser-trimming apparatus 34 permits a part of the laser beam light projected from the laser-beam light source 36 to pass through the mirror 40 after it passes through the Q-switching element 37, the attenuation element 38 and the beam expander 39, thereby permitting it to be projected onto an incident-light power meter 41. Another part of the laser beam light reflected from the semitransparent mirror 40 is projected onto an object lens 42 of the laser-trimming apparatus 34. The object lens 42 is used for performing a focus control of the laser beam light.

After completion of the focus control operation, the thus controlled incident laser beam light is projected onto the wafer 44 mounted on an x-y stage 43 of the laser-trimming apparatus 34. The wafer 44 carries the IC chip 30 on which the redundant bit 26 and the position-alignment marks 31 are formed.

The Q-switching element 37, the attenuation element 38, the beam expander 39, the semitransparent mirror 40 and the object lens 42 constrictor a laser-beam projecting means.

A second semitransparent mirror 45 of the laser-trimming apparatus 34 further reflects a part of the light reflected from the wafer 44. This part has passed through the object lens 42 and the first semitransparent mirror 40 on its return path. Consequently, the second semitransparent mirror 45 has the thus further reflected part of the light therefrom enter a TV monitor camera 46 of the laser-trimming apparatus 34. The remaining part of the reflected light from the wafer 44, which has passed through the second semitransparent mirror 45 in addition to the object lens 42 and the first semitransparent mirror 40, enters a reflected-light power meter 47 of the laser-trimming apparatus 34. Consequently, it is possible for an operator of the apparatus 34 to confirm conditions of the wafer 44 through the TV monitor camera 46 during the position-alignment process and laser-trimming process.

The laser-trimming apparatus 34 is operated as follows. The incident-light power meter 41 measures the incident light's intensity and issues an incident-light-intensity signal to a reflectance-ratio-calculating circuit 48. Also, the reflected-light power meter 47 measures the reflected light's intensity and issues a reflected-light-intensity signal to the reflectance-ratio-calculating circuit 48. Based on these signals, the reflectance-ratio calculating circuit 48 then calculates the ratio of reflected-light intensity to incident-light intensity, i.e., the reflectance ratio. It then issues reflectance-ratio data to an arithmetic processing means 49 which controls the entire laser-trimming apparatus 34 in operation.

In the laser-trimming apparatus 34, a memory means 50, connected to the arithmetic processing means 49, comprises a first memory portion 50a, a second memory portion 50b, a ROM 50c and a RAM 50d. The first memory portion 50a stores primary-test data such as redundant-chip data, address data and like data; the second memory portion 50b stores position and cutting condition data from design patterns such as the coordinates of the position-detecting targets 2 of the position-alignment marks and the fuse 27 for the redundant bit 26; and the ROM 50c stores system programs for enabling the arithmetic processing means 49 to perform various controls.

Based on the reflectance ratio calculated by the reflectance-ratio-calculating circuit 48, the arithmetic processing means 49 calculates the coordinates of the x-axis targets and the y-axis targets of the position-alignment marks based on an actual coordinate system of the laser-trimming apparatus 34 (hereinafter referred to as the apparatus-basis coordinate system). At the same time, arithmetic processing means 49 reads out necessary data stored in the memory means 50 so that, in the arithmetic processing means 49, the coordinates of the x-axis targets and the y-axis targets of the position-alignment marks based on the apparatus-basis coordinate system are compared with stored coordinates of longitudinal center line of the x-axis targets and the y-axis targets of the position-alignment marks of the coordinate system used in design (hereinafter referred to as the design-basis coordinate system). Thus, a conversion coefficient for converting data based on the apparatus coordinate system into data based on the design coordinate system is determined in the arithmetic processing means 49 of the laser-trimming apparatus 34. Using this conversion coefficient, the actual coordinates of the fuse 27 (to be cut) for the redundant chip on the apparatus-basis coordinate system are determined in the arithmetic processing means 49 based on the previously stored coodinates of the fuse 27 (to be cut) for the redundant chip on the design-basis coordinate system. Thus, the entire laser-trimming apparatus 34 is controlled by the arithmetic processing means 49.

In operation, the RAM 50d provided in the memory means 50 temporarily stores both the conversion coefficient and the position of the fuse (to be cut) based on the apparatus coordinate system. This data is read out of the RAM 50d by the arithmetic processing means 49 as often as necessary during operation.

The x-y stage 43 is driven by a stage driving means 51 in the x and y directions according to instructions issued from the arithmetic processing means 49. Thus, the position of the fuse (to be cut) for the redundant bit 26 of the wafer 44 is mounted on the x-y stage 43 to coincide with the position of the projected laser spot on the wafer 44. The projected laser spot is produced by a laser beam light passing through the above-described optical system (shown in FIG. 13) of the laser-trimming apparatus 34.

In accordance with instructions issued from the arithmetic processing means 49, a light-source driving means 52 of the laser trimming apparatus 34 controls the laser pulse intensity by turning on and off the Q-switching element 37 and the attenuation element 38 when the position-alignment operation is performed, so that the laser beam light's intensity is controlled when it is emitted during the position-alignment operation.

Next, the operation of the laser-trimming is described with reference to a process sequence ranging from the position alignment step to the laser-pulse emission step illustrated in FIG. 14.

Figure 12:
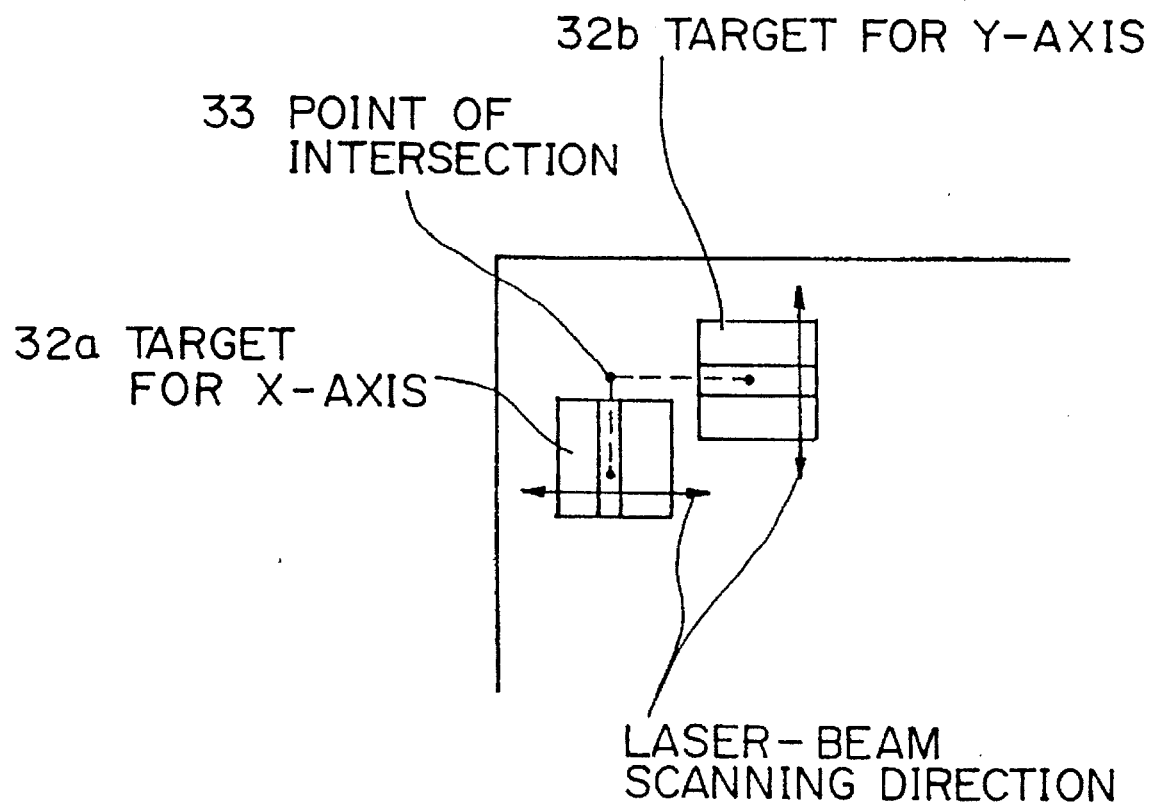
FIG. 12 is a partially enlarged plane view of the chip shown in FIG. 11, illustrating an intersection point at which a longitudinal center line of a position-detecting target of a position-alignment mark used for the x-axis intersects with a longitudinal center line of a position-detecting target of a position-alignment mark used for the y-axis.

First, the position-alignment operation is performed by detecting the intersection points 33 (shown in FIG. 12) of the position-alignment marks 31 disposed on the chip 30 (shown in FIGS. 11 and 12) based on the apparatus coordinate system. The intersection points 33 are points at which longitudinal center lines of the x-axis target 32a of the position-alignment mark 31 and longitudinal center lines of the y-axis target 32b of the position-alignment mark 31 intersect, as shown in FIG. 12. In the embodiment shown in FIGS. 11 and 12, since a pair of position-alignment marks 31 is disposed in every corner portion of the chip. 30, the total number of intersection points 33 appearing in the chip 30 is four. FIG. 12 shows an example of an intersection point 33. The position alignment may be sufficiently accomplished by detecting at least one pair of intersection points 33. Accuracy in position alignment increases as the number of detected intersection points 33 increases. Detection of the intersection points 33 is made by detecting each of the x-axis targets 32a and each of the y-axis targets 32b corresponding thereto.

In step 1 (hereinafter referred to as ST1) of the process sequence shown in FIG. 14, the position of the first intersection point is detected from the x-axis target 32a in step 1x (hereinafter referred to as ST1x) and from the y-axis target 32b in step 1y (hereinafter referred to as ST1y). That is, ST1 is composed of ST1x and ST1y, as shown in FIG. 14.

Figure 15:
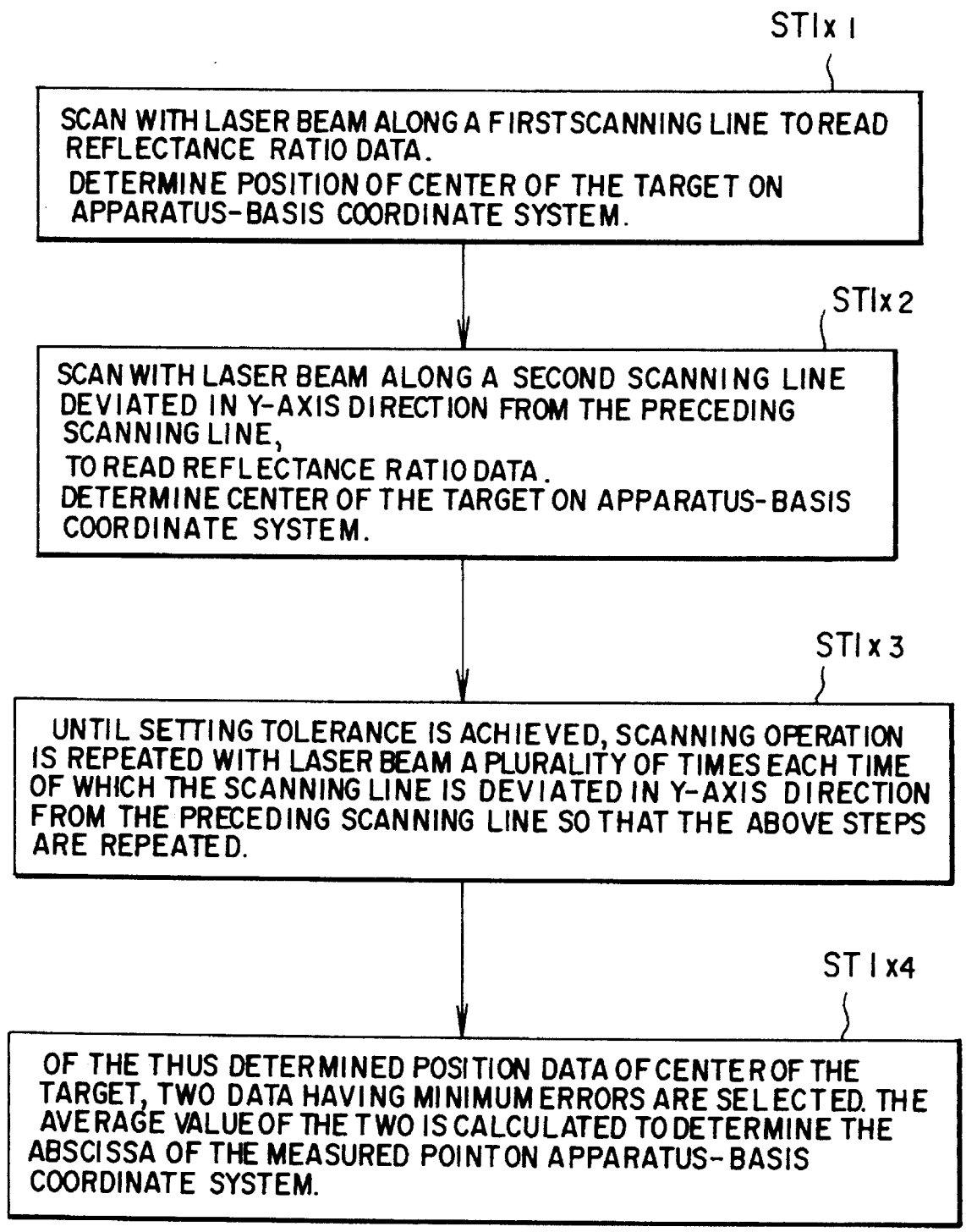
FIG. 15 is a flow diagram showing a process sequence for detecting the position detecting target used for the x-axis.

FIG. 15 shows a process sequence of ST1x for detecting the x-axis target 32a.

ST1x comprises a series of sub-steps ST1x1, ST1x2, ST1x3 and ST1x4. In ST1x1 the reflectance-ratio calculating circuit 48 of the laser-trimming apparatus 34 shown in FIG. 13 calculates the reflectance ratio to determine the position of the center of the x-axis target 32a based on the apparatus-basis coordinate system. That is, in ST1x1, the x-y stage 43 is moved in the x-axis direction so that the laser beam light can linearly scan a specified area around a predicted target position on the wafer 44. This specified area ranges from ±20 to ±80 microns long in the x-axis direction. For every pass of the above scanning cycle of the specified area with the laser beam light on the wafer 44, the reflectance-ratio calculating circuit 48 of the laser-trimming apparatus 34 obtains about 1024 pieces of digital information on the reflectance ratio. Then, based on the difference in reflectance ratios between the scattering pattern of the position-alignment mark 31 and the target pattern of the same mark 31, the width of the target in the laser-beam scanning direction is based on the apparatus coordinate system. Strictly speaking, the width of the target based on the apparatus coordinate system does not coincide with the design width of the target based on the design coordinate system because of light scattered by the edge portions of the position-detecting target of the position-alignment mark 31. Consequently, the actual width of the position-detecting target 2 determined by measuring the reflectance ratio based on the apparatus coordinate system is compared with the design width of the position-detecting target based on the design coordinate system so as to determine the x-coordinate of longitutional center line of the position-detecting target 2 of the position-alignment mark 31.

In the ST1x2, the x-y stage 43 of the laser-trimming apparatus 34 is moved about 5 to 7 microns by a stage driving means 51 in the y-axis direction, so that substantially the same operation as that performed in the ST1x1 is performed at the other position to determine the x-coordinate of longitudinal center line of the position-detecting target.

In the ST1x3, a difference between the thus determined x-coordinate of longitudinal center line of the pair of position-detecting targets is determined so as to judge whether or not this difference is within a setting tolerance which is for example 0.3 microns. If the difference is greater than the setting tolerance, the above sub-steps are repeated a plurality of times. Each time, the x-y stage 43 is moved 5 to 7 microns in the y-axis direction. When the difference is less than the setting tolerance, the following sub-step, i.e., ST1x4 is conducted.

In ST14 the two pieces of data with the smallest error are selected from the x-coordinate data of the position-detecting targets determined in the above sub-steps. Then, the average value of these two pieces of data is calculated to determine the x-coordinate of the measured point of the x-axis target based on the apparatus coordinate system.

Figure 14:
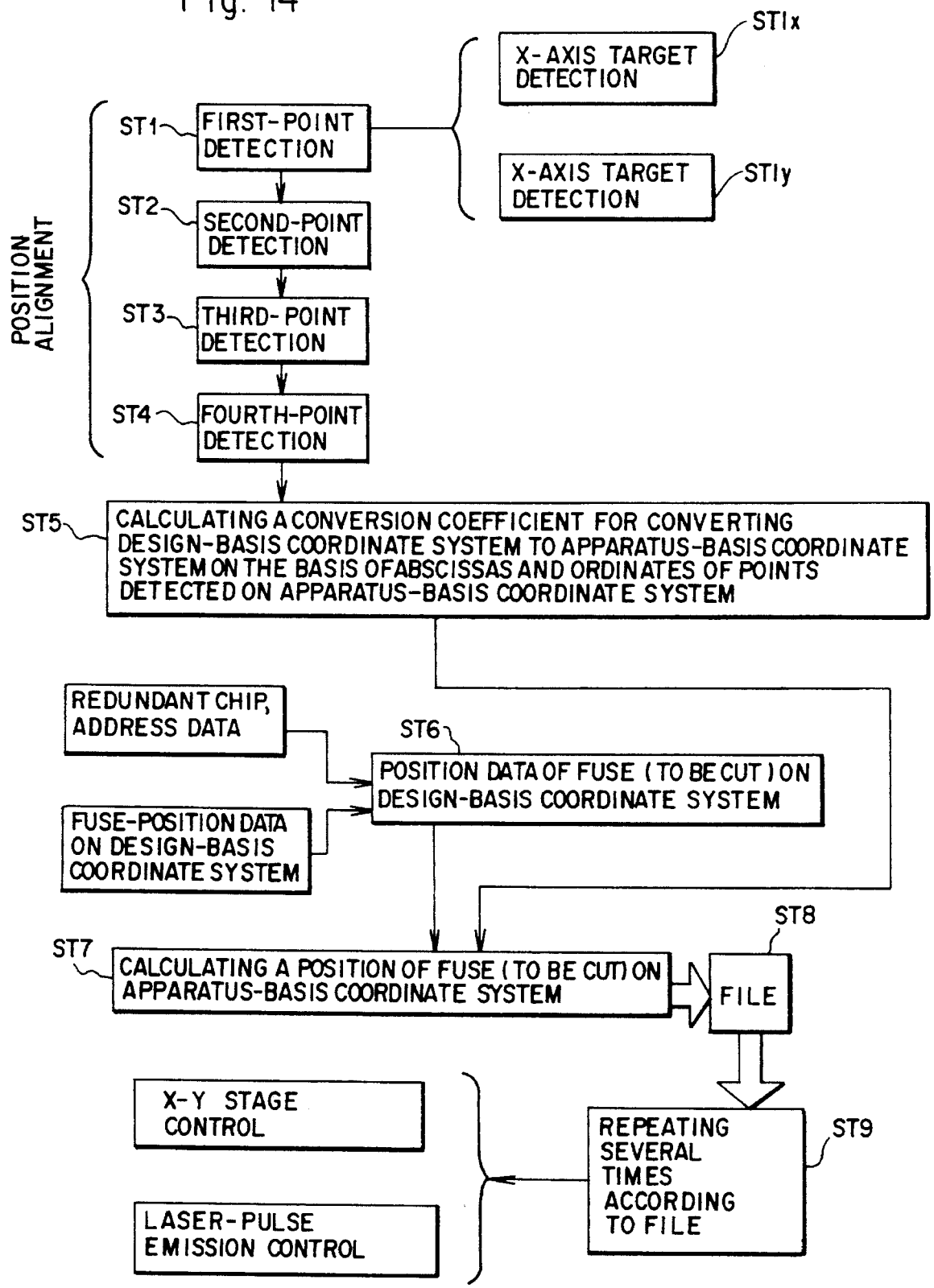
FIG. 14 is a flow diagram showing a process sequence ranging from the position-alignment step to the laser-beam emission step.

As described above, the x-coordinate of the first point shown in FIG. 14 is determined through the sub-step ranging from ST1x1 to ST1x4 shown in FIG. 15. Further, step ST1y for detecting the position of the y-axis target can be conducted, by simply replacing the x-axis with the y-axis in ST1x used for detecting the position of the x-axis target. Thus, ST1y can determine the y-coordinate of the y-axis target based on the apparatus coordinate system. As a result, ST1 can determine both the x and y coordinates of the first point (shown in FIG. 14) based on the apparatus coordinate system.

To determine the positions of the second, third and fourth points shown in FIG. 14, step 2, step 3 and step 4 (hereinafter referred to as ST2, ST3 and ST4) are conducted in the same manner as ST1. Therefore, ST2, ST3 and the ST4 are not described here. By conducting at least ST1 and ST2 and, if necessary, ST3 and the ST4, it is possible to determine the coordinates of at least the first and second points of the chip 30 based on the apparatus-coordinate system, the chip 30 being formed on the wafer 44 on the x-y stage. If necessary, it is possible to determine the coordinates of the third and the fourth points in addition to ST1 and ST2 based on the apparatus coordinate system.

Then, in step 5 (hereinafter referred to as ST5), the conversion coefficient for converting data based on the apparatus coordinate system into data based on the design coordinate system is calculated. This calculation is conducted by comparing the actual x and y coordinates (of the positions of at least the first and the second point based on the apparatus coordinate system, the actual coordinates being determined in ST1 and ST2) with the previously stored x and y coordinates (of the positions of at least the first and the second point based on the design coordinate system). For example, by comparing the difference in the coordinates and the direction between the actual positions of the first point and second points based on the apparatus coordinate system and the previously stored positions of the first and second points based on the design coordinate system, it is possible to determine the expansion and contraction of the device pattern occurring in the semiconductor fabrication process. It is also possible to calculate the conversion coefficient for converting data based on the apparatus coordinate system into data based on the design coordinate system.

Thus, in step 6 (hereinafter referred to as ST6), the coordinates of the fuse 27 (to be cut) is read out of the memory means 50 (shown in FIG. 13) which stores primary-test data such as redundant-chip data and address data in addition to the position data of the fuse based on the design coordinate system.

Next, in step 7 (hereinafter referred to as the ST7), the actual coordinates of the fuse 27 (to be cut) based on the apparatus coordinate system is determined based on the conversion coefficient calculated in ST5, in addition to the previously stored coordinates of the fuse 27 (to be cut) based on the design coordinate system, the data as to which previously stored coordinates is read out of the memory means 50 in ST6. In ST8 thus obtained data is stored in a file.

In step 9 (hereinafter referred to as ST9), in accordance with the data thus filed in ST8, the position of x-y stage 43 is adjusted by the stage driving means 51 so as to project the laser beam light onto the fuse 27 (to be cut) for the redundant bit 26, the fuse 27 being carried by the wafer 44. After adjustment of the x-y stage 43 is complete, the laser-trimming apparatus 34 projects the laser pulse onto the wafer 44. Therefore, according to the file, adjustment of the x-y stage 43 and emission of the laser pulse are repeated several times.

As described above, in the present invention, the amount of laser beam light reflected from the position-alignment mark is measured to determine the reflectance ratio of the position-alignment mark. Then, based on the variation of the thus determined reflectance ratio, at least two actual x-coordinates and two actual y-coordinates of the intersection points of the position-alignment marks are determined based on the apparatus coordinate system. At the same time, the actual position data of the intersection points based on the apparatus coordinate system is compared with the previously stored position data of the intersection points based on the design coordinate system to calculate the conversion coefficient for converting the actual position data of the intersection points based on the apparatus coordinate system into the previously stored position data of the intersection points based on the design-basis coordinate system. Then, using the the calculated conversion coefficient and the primary-test data such as the redundant-chip data and the address data in addition to the previously stored position data of the fuse on the design-basis coordinate system, the position of the fuse (to be cut) is precisely determined based on the apparatus coordinate system so that the laser beam light is precisely projected onto the fuse. Therefore, in the laser-trimming apparatus 34 of the present invention shown in FIG. 13, there is substantially no danger of a cutting failure with respect to the fuse for the redundant bit.

Incidentally, in the above embodiments of the present invention, although both position-alignment mark and the laser-trimming apparatus are described to be used in the operation of cutting the fuse for the redundant bit. They can also be used infor any other application field.

As described above, in the position alignment operation conducted with the optical system such as the laser-beam light system, the position-alignment mark of the present invention considerably strengthens the contrast between it and its background by making a great difference in the amount of reflected laser beam light between the mark and its background. This strengthened contrast considerably improves the so-called SN ratio to enable precise position alignment.

In addition, in the laser-trimming apparatus of the present invention and the laser-trimming method of the present invention, since the position to be trimmed is precisely determined and the laser beam light is precisely projected onto this position, there is substantially no danger of a trimming failure as to such position.

What is claimed is:

1. A position-alignment mark comprising:

a first light-reflective film;

a plurality of second light-reflective films provided separate from and adjacent to said first light-reflective film, each being smaller than said first light-reflective film, said first and second light-reflective films having a substantially higher reflective property than areas therebetween;

a light-transmissible film for covering said first and second light-reflective films; and a plurality of said second light-reflective films are arranged separate from one another and covered with said light-transmissible film forming a concave-and-convex surface of said light-transmissible film.

2. The position-alignment mark according to claim 1, wherein a reflective area having a plane for vertically reflecting a position detecting light is obtained by covering said first light-reflective film with said light-transmissible film, and a vertical reflectance reducing area having a convex-and-concave surface for scattering said position detecting light to reduce the vertical reflection is obtained by covering said second light-reflective film with said light-transmissible film.

3. The position-alignment mark according to claim 1, wherein
a plurality of said second light-reflective films are formed of strips extending transverse to a scanning direction of position detecting light.

4. The position-alignment mark according to claim 1, wherein
a plurality of said second light-reflective films are formed in a pattern of dots.

5. The position-alignment mark according to claim 1, wherein
a plurality of said second light-reflective films are formed in a pattern of a checker board.

6. The position-alignment mark according to claim 2, wherein
said vertical reflectance reducing area is provided with a base film forming steps to make strips extending vertically to the scanning direction of position detecting light, over which a plurality of said second light-reflective films are covered.

7. The position-alignment mark according to claim 2, wherein
said vertical reflectance reducing area is provided with a base film forming concave portions to make a pattern of dots, over which a plurality of said second light-reflective films are covered each having concavity at the center.

8. The position-alignment mark according to claim 2, wherein
said vertical reflectance reducing area is an I shape and is surrounded by said reflective area.

9. The position-alignment mark according to claim 2, wherein
said vertical reflectance reducing area is an L shape and is surrounded by said reflective area.

10. The position-alignment mark according to claim 2, wherein
said vertical reflectance reducing area is an II shape and is surrounded by said reflective area.

11. The position-alignment mark according to claim 2, wherein
said vertical reflectance reducing area is an + shape and is surrounded by said reflective area.

12. The position-alignment mark according to claim 2, wherein
said reflective area is an I shape and is surrounded by said vertical reflectance reducing area.

13. The position-alignment mark according to claim 2, wherein
said reflective area is an L shape and is surrounded by said vertical reflectance reducing area.

14. The position-alignment mark according to claim 2, wherein
said reflective area is an II shape and is surrounded by said vertical reflectance reducing area.

15. The position-alignment mark according to claim 2, wherein
said reflective area is an + shape and is surrounded by said vertical reflectance reducing area.

16. The position-alignment mark according to claim 1, wherein
said first and second reflective films are made of aluminum.

17. The position-alignment mark according to claim 1, wherein
said light-transmissible film is made of phosphosilicate glass.

18. The position-alignment mark according to claim 1, wherein
said light-transmissible film is made of plasma nitride film.

19. The position alignment mark according to claim 2, wherein
the convex-and-concave light-transmissible film of said vertical reflectance reducing area is formed of a plane portion, an edge portion, and a gap portion of a plurality of said second light-reflective films.

20. The position-alignment mark according to claim 2, wherein said plurality of second light reflective films include generally planar uppermost reflective surface.

21. The position-alignment mark according to claim 2, wherein said plurality of second light reflective films are aluminum layers.

22. The position-alignment mark according to claim 2, wherein said plurality of second light reflective films are positioned angularly above a respective shoulder forming layer.

23. The position-alignment mark according to claim 22, wherein said plurality of second light reflective films and said shoulder forming layers are aluminum layers.

24. The position-alignment mark according to claim 22, wherein said plurality of second light reflective films include concave aluminum layers.

* * * * *